United States Patent
Kim

(10) Patent No.: US 11,543,328 B2
(45) Date of Patent: Jan. 3, 2023

(54) AUTOMATED FUNCTIONAL TESTING SYSTEMS AND METHODS OF MAKING AND USING THE SAME

(71) Applicant: CVE Technology Group, Inc., Allen, TX (US)

(72) Inventor: Myung Ki Kim, Mckinney, TX (US)

(73) Assignee: Kyutaek Cho, Saddle River, NJ (US)

( * ) Notice: Subject to any disclaimer, the term of this patent is extended or adjusted under 35 U.S.C. 154(b) by 602 days.

(21) Appl. No.: 16/629,570

(22) PCT Filed: Apr. 6, 2018

(86) PCT No.: PCT/US2018/026414
§ 371 (c)(1),
(2) Date: Jan. 9, 2020

(87) PCT Pub. No.: WO2018/187659
PCT Pub. Date: Oct. 11, 2018

(65) Prior Publication Data
US 2021/0364567 A1  Nov. 25, 2021

Related U.S. Application Data

(60) Provisional application No. 62/482,199, filed on Apr. 6, 2017.

(51) Int. Cl.
*G01M 99/00* (2011.01)
*G01R 31/28* (2006.01)
(Continued)

(52) U.S. Cl.
CPC ........... *G01M 99/005* (2013.01); *B25J 9/161* (2013.01); *B25J 9/1674* (2013.01); *B65G 61/00* (2013.01);
(Continued)

(58) Field of Classification Search
CPC .... G01M 99/005; G01M 99/008; B25J 9/161; B25J 9/1674; B65G 61/00;
(Continued)

(56) References Cited

U.S. PATENT DOCUMENTS

2006/0100841 A1   5/2006   Wu et al.
2007/0159198 A1   7/2007   Teoh et al.
(Continued)

FOREIGN PATENT DOCUMENTS

CN   102387234 A   3/2012
CN   104168349 A   11/2014
(Continued)

OTHER PUBLICATIONS

International Search Report and Written Opinion for International Application No. PCT/US2018/026414 dated Jul. 30, 2018, 9 pages.

(Continued)

*Primary Examiner* — Tarun Sinha
*Assistant Examiner* — James I Burris
(74) *Attorney, Agent, or Firm* — EcoTech Law Group, P.C.

(57) ABSTRACT

An automatic robot control system and methods relating thereto are described. These systems include components such as a touch screen panel ("TSP") robot controller for controlling a TSP robot, a camera robot controller for controlling a camera robot and an audio robot controller for controlling an audio robot. The TSP robot operates inside a TSP testing subsystem, the camera robot operates inside a camera testing subsystem, and the audio robot operates inside an audio testing subsystem. Inside the audio testing subsystem, an audio signals measurement system, using a bi-directional coupling, controls the operation of the audio robot controller. In this control scheme, a test application controller is designed to control the different types of (Continued)

subsystem robots. Methods relating to TSP, camera, and audio robots, and their controllers, taken individually or in combination, for automatic testing of device functionalities are also described.

23 Claims, 27 Drawing Sheets

(51) Int. Cl.

| | | |
|---|---|---|
| *G06F 11/273* | (2006.01) | |
| *G10K 11/16* | (2006.01) | |
| *G10L 25/51* | (2013.01) | |
| *H04R 29/00* | (2006.01) | |
| *B65G 61/00* | (2006.01) | |
| *G06F 3/041* | (2006.01) | |
| *H04N 17/00* | (2006.01) | |
| *B25J 9/16* | (2006.01) | |
| *G06F 11/263* | (2006.01) | |
| *G06F 11/267* | (2006.01) | |
| *G01L 25/00* | (2006.01) | |
| *G03B 43/00* | (2021.01) | |

(52) U.S. Cl.
CPC ............ *G01L 25/00* (2013.01); *G01M 99/008* (2013.01); *G01R 31/2834* (2013.01); *G03B 43/00* (2013.01); *G06F 3/0416* (2013.01); *G06F 11/263* (2013.01); *G06F 11/267* (2013.01); *G06F 11/273* (2013.01); *G06F 11/2733* (2013.01); *G10K 11/16* (2013.01); *G10L 25/51* (2013.01); *H04N 17/002* (2013.01); *H04R 29/001* (2013.01); *H04R 29/004* (2013.01)

(58) Field of Classification Search
CPC . G01R 31/2834; G06F 3/0416; G06F 11/263; G06F 11/267; G06F 11/273; G06F 11/2733; G10K 11/16; G10L 25/51; H04N 17/002; H04R 29/001; H04R 29/004; G01S 19/03; G01S 19/23; H04M 1/24; G03B 43/00
See application file for complete search history.

(56) References Cited

U.S. PATENT DOCUMENTS

| | | | | |
|---|---|---|---|---|
| 2016/0192213 | A1* | 6/2016 | Diperna | .................. H04B 17/21 455/425 |
| 2016/0224023 | A1 | 8/2016 | Huang et al. | |
| 2016/0337053 | A1 | 11/2016 | Diperna et al. | |

FOREIGN PATENT DOCUMENTS

| | | | | | |
|---|---|---|---|---|---|
| CN | 105025142 | A | | 11/2015 | |
| CN | 105338149 | A | * | 2/2016 | |
| CN | 105338149 | A | | 2/2016 | |
| CN | 205725983 | U | | 11/2016 | |
| KR | 100213105 | B1 | * | 2/1999 | |
| KR | 2000004195 | A | * | 1/2000 | |
| KR | 2007000139 | A | * | 1/2007 | ............ G01R 31/26 |
| WO | 2014161003 | A1 | | 10/2014 | |

OTHER PUBLICATIONS

Drbis Systems Oy, "Mobile Phone Functional Testing MMI", retrieved on Mar. 27, 2017, p. 2.

* cited by examiner

AUTOMATED FUNCTIONAL TESTING SYSTEMS AND METHODS OF MAKING AND USING THE SAME

RELATED APPLICATION

This application claims the benefit from International Application No. PCT/US2018/026414, which was granted an International filing date of Apr. 6, 2018, which in turns claims priority to U.S. provisional application No. 62/482,199, with a filing date of Apr. 6, 2017, which are incorporated herein by reference in its entirety for all purposes.

FIELD

The present teachings generally relate to novel systems and methods relating to automated functional testing of devices (e.g., hand-held devices like smart phones). More particularly, the present teachings relate to novel systems and methods that automatically test devices for various functionalities, such as their download functionalities, touch screen panel functionalities, camera functionalities and audio functionalities.

BACKGROUND

Hand-held devices, such as smart phones, have become valuable for more than just making and receiving phone calls. Myriad of features offered by hand-held devices require integration of many complicated components. In the event of device failure, these components are subjected to various tests, most of which are manual in nature. To the extent certain types of tests are automated, they are not automated enough and are, therefore, time consuming and translate into a lower throughput for the device testing process.

What is, therefore, needed are automated systems and methods that automatically, rapidly and accurately test the different functionalities offered by a hand-held device.

SUMMARY

To achieve the foregoing, the present arrangements and teachings offer systems and methods relating to automated functional testing of hand-held devices. In their failed state, hand-held devices are subjected to testing, according to present systems and methods, and are referred to as "test devices." Once the test devices are tested for defects, their identified defects are repaired, and they are reconfigured to their original factory form. In their reconfigured form, the hand-held devices may be sold as a refurbished item.

In one aspect, the present teachings provide automatic functional testing systems. One exemplar automatic functional testing system includes: (i) a touch screen panel ("TSP") load conveyor; (ii) a TSP unload conveyor; (iii) a TSP reject conveyor; (iv) multiple TSP testing jigs; (v) multiple TSP testing shuttles; (vi) a TSP robot; and (vii) a TSP load/unload robot.

The TSP load conveyor is for carrying a test device inside a TSP load/unload region of a TSP testing subsystem. The TSP unload conveyor is designed to remove, from the TSP load/unload region of the TSP testing subsystem, the test device that passes testing inside the TSP testing subsystem. The TSP reject conveyor is for removing, from the TSP load/unload region of the TSP testing subsystem, the test device that fails testing inside the TSP testing subsystem.

Multiple TSP testing jigs are disposed between the TSP load conveyor and the TSP unload conveyor or the TSP reject conveyor. Each of the multiple TSP testing shuttles is designed to have one of the TSP testing jigs secured thereon, and is designed to displace a TSP testing jig, in the Y-direction, back and forth from the TSP load/unload region to a TSP test region (where TSP testing is carried out).

The TSP robot includes a stylus end effector and is designed to contact predetermined contact regions on the display screen of the test device for testing TSP functionalities of the test device.

The TSP load/unload robot, in a first operative state, transfers test device from the TSP load conveyor to one of the multiple TSP testing jigs. In a second operative state, the TSP load/unload robot transfers test device from one of the multiple TSP testing jigs to the TSP unload conveyor when test device passes testing inside the TSP testing subsystem. In a third another operative state, the TSP load/unload robot transfers test device from one of the multiple TSP testing jigs to the TSP reject conveyor when test device fails testing inside the TSP testing subsystem. The TSP load/unload robot, in each of these different operative states, traverses in the X-direction, from side-to-side, to load or unload test device inside the TSP load/unload region, for example, before and after testing inside the TSP subsystem. The TSP load/unload robot is different from, and not the same as the TSP robot.

The above-described automatic functional testing system may further include a test application controller that controls operation of a TSP robot controller and that provides TSP test applications to test TSP functionalities of the test device. The TSP robot controller may control operation of each of the TSP load/unload robot, the TSP robot and multiple TSP testing shuttles.

The above-mentioned TSP reject conveyor, preferably, extends in a direction that is perpendicular to a direction of extension of the TSP load conveyor or of the TSP unload conveyor. In preferred present arrangements and at one end of the TSP testing subsystem, the TSP load conveyor aligns with or is same as download unload conveyor that is part of a download testing subsystem. At the other end of the TSP testing subsystem, the TSP unload conveyor aligns with or is same as a camera load conveyor that is part of a camera testing subsystem.

In another aspect, the present teachings provide methods of automated functional testing. One exemplar method includes: (i) determining or receiving information whether TSP jig is vacant, wherein the TSP testing jig is present inside a TSP testing subsystem; (ii) determining, using a TSP load conveyor sensor, whether a test device is detected on a TSP load conveyor; (iii) placing, using a TSP load/unload robot, the test device on the vacant TSP testing jig to produce an occupied TSP testing jig, if the TSP testing jig is deemed to be vacant, and if the test device is detected on the TSP load conveyor; (iv) downloading, using a wireless connection and on the test device, one or more TSP test applications that are stored on a test application controller; (iv) testing, using one or more of the TSP test applications in conjunction with the TSP robot, TSP functionalities of the test device; and (v) generating a TSP test result, which indicates whether the test device passed or failed the testing TSP functionalities; (vi) conveying, using the TSP load/unload robot, the test device present at the occupied TSP testing jig to a TSP unload conveyor, if the TSP test result indicates that the test device passed testing of the TSP functionalities; and (vii) removing, using the TSP load/unload robot, the test device from the occupied TSP testing jig to a TSP reject conveyor, if the TSP test result indicates that the test device failed testing of the TSP functionalities.

Each of the above-describe steps of conveying or removing may include: (i) moving a TSP testing shuttle from a TSP test region to a TSP load/unload region, wherein the TSP testing jig is secured on the TSP testing shuttle; (ii) picking up, using the TSP load/unload robot, the test device from the TSP testing jig; and (iii) displacing the TSP load/unload robot in the X-direction and away from the TSP test region.

Testing TSP functionalities of the test device includes, for example, testing one without-axis functionality, which may be one functionality chosen from a group comprising wireless connection-related functionality, short range wireless interconnection-related functionality, and charging functionality of the test device. The term, "without-axis functionality," as used herein, refers to functionalities that do not require linear movement of the test device along any of X-direction, Y-direction and Z-direction.

During testing of TSP functionalities, the present automated functional testing methods may draw, using a stylus robot, a pattern on the display screen of the test device. To create this pattern, the method includes a step of moving the stylus robot in X-direction, Y-direction and Z-direction. This pattern is drawn when the stylus contacts the test device undergoing TSP testing, and one or more of the TSP test applications are active on the test device.

In accordance with one embodiment of the present teachings, testing TSP functionalities of the test device includes testing three-dimensional functionalities. In this test, the stylus robot displaces in X-direction, Y-direction and Z-direction. The displacement of the stylus in Z-direction is, preferably, accompanied by the following steps: (i) contacting, using the stylus robot, one or more predetermined contact regions on the display screen of the test device; (ii) applying varying amount of pressure on each of one or more of the predetermined contact regions; and (iii) evaluating an amount of light emitted through the display screen under varying amount of pressure. One or more of the predetermined contact regions are scattered on the display device so that different parts of the displays screen are tested during the testing TSP functionalities.

Once testing of TSP functionalities is complete, the present automated functional testing methods contemplate, using the test application controller, to providing the TSP test results from the TSP robot controller to the TSP load/unload robot. This triggers the TSP load/unload robot to be informed on whether to unload the test device (which has passed TSP testing) on the TSP unload conveyor so that the test device is advanced for further testing, or to remove the test device (which has failed TSP testing), using the TSP reject conveyor, from the TSP testing subsystem.

After TSP testing is successfully completed, the present automated functional testing methods, preferably, include a step of testing camera functionalities of the test device, in a camera testing subsystem. As a result, prior to camera testing, the present methods may include conveying the test device to a TSP unload conveyor, which removes the test device from the TSP testing subsystem.

Examples of testing TSP functionalities includes testing for at least one functionality of the test device chosen from a group comprising test application launching functionality, applications launching functionality, wireless connection-related functionality, short range wireless interconnection-related functionality, geometric sensing-related functionality, global positioning system ("GPS")-related functionality, charging functionality, touch screen functionality, three-dimensional touch functionality, advance touch functionality and with-axis functionality. The term, "with-axis functionality," as used herein, refers to functionalities that require movement, e.g., along X-direction, Y-direction and/or Z-direction, of the test device.

In certain preferred embodiments of the present teachings, the above-described method of automated functional testing may further include performing download testing prior to the determining or the receiving information whether download testing jig is vacant. This step of performing includes: (i) determining or receiving information whether a download testing jig is vacant, wherein the download testing jig is present inside a download testing subsystem; (ii) determining, using a download load conveyor sensor, whether a test device is detected on a download load conveyor; (iii) placing, using a download load/unload robot, the test device on the vacant download testing jig to produce an occupied download testing jig, if the download testing jig is deemed vacant, and if the test device is detected on the download load conveyor; (iv) introducing, using a download robot, a download test application connector inside a test application receiving port on the test device to form a download test application connection (e.g., USB® connection); (v) downloading on the test device, using the download test application connection, one or more download test applications stored on a download test application controller, which is different from the test application controller; (vi) testing download functionalities of the test device, using the download test application controller in conjunction with one or more of the download test applications (e.g., wireless connection profile) stored on the test device; (vii) generating a download test result, which indicates whether the test device passed or failed the testing download functionalities; (viii) conveying, using the download load/unload robot, the test device present at the occupied download testing jig to a download unload conveyor, if the download test result indicates that the test device passed testing of the download functionalities; and (ix) removing, using the download load/unload robot, the test device from the occupied download testing jig to a download reject conveyor, if the download test result indicates that the test device failed testing of the download functionalities.

In another aspect, the present arrangements provide another type of automated functional testing systems. One exemplary system includes: (i) a camera load conveyor; (ii) a camera unload conveyor; (iii) a camera reject conveyor; (iv) multiple camera testing jigs; (v) multiple camera testing shuttles; (vi) a camera robot; and (vii) a camera load/unload robot.

The camera load conveyor is for carrying test device inside a camera load/unload region of a camera testing subsystem. The camera unload conveyor is for removing from the camera load/unload region of the camera testing subsystem test device that passes testing inside the camera testing subsystem. The camera reject conveyor is for removing from the camera load/unload region of the camera testing subsystem test device that fails testing inside the camera testing subsystem.

Multiple camera testing jigs are disposed between the camera load conveyor and the camera unload conveyor or the camera reject conveyor. Each of the multiple camera testing shuttles is designed to have one of the camera testing jigs secured thereon, and is designed to displace a camera testing jig, in Y-direction, back and forth from the camera load/unload region to a camera test region (where camera testing is carried out).

A camera robot including a two-axis robot, which, in an operative state, displaces in the X-direction and/or the Z-direction to contact predetermined contact regions on display screen, actuate keys and/or buttons, and/or stress components of test device that contribute to camera functionalities.

The camera load/unload robot, in a first operative state, transfers test device from the camera load conveyor to one of the multiple camera testing jigs. In a second operative state, the camera load/unload robot transfers test device from one of the multiple camera testing jigs to the camera unload conveyor when test device passes testing inside the camera testing subsystem. In the third operative state, the camera load/unload robot transfers test device from one of the multiple camera testing jigs to the camera reject conveyor when test device fails testing inside the camera testing subsystem. The camera load/unload robot, in these different operative states, traverses in X-direction, from side-to-side, to load or unload the test device, for example, before and after testing inside the camera subsystem. In such systems, the camera load/unload robot is different from, and not the same as, the camera robot.

In a preferred arrangements, the above-described automatic functional testing system includes a test application controller that controls operation of a camera robot controller and that provides camera test applications to test camera functionalities of test device. The camera robot controller may control operation of each of the camera load/unload robot, the camera robot and multiple camera testing shuttles. Like the configuration shown in the TSP testing subsystem, in the camera testing subsystem integrates the camera reject conveyor such that the conveyor extends in a direction that is perpendicular to a direction of extension of the camera load conveyor or of the camera unload conveyor. The camera load conveyor, preferably aligns with or is same as the TSP unload conveyor, and the camera unload conveyor aligns with or is same as an audio load conveyor, which is part of an audio testing subsystem.

In preferred embodiments, the camera robot, integrated in the present automated functional testing systems, includes a pen-shaped end effector and a covering end effector. The pen-shaped end effector, in an operative state, contacts predetermined contact regions on the display screen, actuates keys and/or buttons, and/or stresses components of the test device that contribute to camera functionalities. In another operative state of the camera robot, the covering end effector covers light or proximity sensor of test device. The camera robot may include a cylinder that contributes to displacement of the two-axis robot in the Z-direction.

In another aspect, the present teachings provide another type of automated functional testing methods. One exemplar method includes: (i) determining or receiving information whether a camera jig is vacant, wherein the camera testing jig is present inside a camera testing subsystem; (ii) determining, using a camera load conveyor sensor, whether a test device is detected on a camera load conveyor; (iii) placing, using a camera load/unload robot, the test device on the vacant camera testing jig to produce an occupied camera testing jig, if the camera testing jig is deemed to be vacant, and if the test device is detected on the camera load conveyor; (iv) downloading, using a wireless connection and on the test device, one or more camera test applications that are stored on a test application controller; (v) testing, using one or more of the camera test applications in conjunction with a camera test robot, camera functionalities of the test device; (vi) generating a camera test result, which indicates whether the test device passed or failed the testing camera functionalities; (vii) conveying, using the camera load/unload robot, the test device present at the occupied camera testing jig to a camera unload conveyor, if the camera test result indicates that the test device passed the testing of the camera functionalities; and (viii) removing, using the camera load/unload robot, the test device from the occupied camera testing jig to a camera reject conveyor, if the camera test result indicates that the test device failed testing of the camera functionalities.

Each of the above-describe steps of conveying or removing may include: (i) moving a camera testing shuttle from a camera test region to a camera load/unload region, wherein the camera testing jig is secured on the camera testing shuttle; (ii) picking up, using the camera load/unload robot, the test device from the camera testing jig; and (iii) displacing the camera load/unload robot in the X-direction and away from the camera test region.

Testing camera functionalities of the test device include testing one functionality of the test device chosen from a group comprising without-axis functionality, proximity sensing functionality, light sensing functionality, side key functionality, accelerator sensor functionality, front camera functionality, front video functionality, rear camera functionality, and rear video functionality.

By way of example, testing the accelerator functionality of the test device includes rotating the test device around an axis that extends along a middle region of the test device, or the camera testing jig (which has the test device secured thereon), such that the test device tilts up at one end in a positive Z-direction, and correspondingly tilts down at another end in a negative Z-direction.

As another example, testing at least one functionality chosen from a group comprising front camera functionality, front video functionality, rear camera functionality, and rear video functionality, includes rotating the test device, by 180° or 360°, around a longitudinal axis that extends along a length of the test device, or a length of a device (which has the test device secured thereon) such that the test device flips a front side to a back side or from the back side to the front side.

After the testing of camera functionalities of the test device is successfully completed and passed, the camera test results are provided, preferably using a test application controller, to the camera load/unload robot. In this preferred embodiment, the camera load/unload robot removes the test device (that has passed testing of camera functionalities) from the camera testing subsystem, and an audio load/unload robot picks up the test device for audio testing. The present automated functional testing may, therefore, include testing audio functionalities of the test device in an audio testing subsystem.

In one aspect, the present arrangements provide automatic functional testing systems. One exemplar automatic functional testing system includes: (i) an audio load conveyor; (ii) an audio unload conveyor; (iii) an audio reject conveyor; (iv) an audio box; (v) multiple audio testing jigs; (vi) multiple audio testing shuttles; (vii) an audio robot; and (viii) an audio load/unload robot.

The audio load conveyor is for carrying test device inside an audio load/unload region of an audio testing subsystem. The audio unload conveyor is for removing out, from the camera load/unload region of the audio testing subsystem, test device that passes testing inside the audio testing subsystem. The audio reject conveyor is for removing out, from the camera load/unload region of the audio testing subsystem, test device that fails testing inside the audio testing subsystem. An audio box comes with appropriate sound insulation, which avoids external noise interference from compromising the reliability and accuracy of the audio test being performed inside the audio box.

Multiple audio testing jigs are disposed inside the audio box. The multiple audio testing jigs are located between the audio load conveyor and the audio unload conveyor or the audio reject conveyor. Each of the multiple audio testing shuttles is designed to have one of the audio testing jigs secured thereon and is designed to displace one of the audio testing jigs, in Y-direction, back and forth from the audio load/unload region to an audio test region.

An audio robot, in an operative state, displaces in the Z-direction to contact predetermined contact regions on display screen, actuate keys and/or buttons, and/or stress components of test device that contribute to audio functionalities.

An audio load/unload robot, in a first operative state, transfers test device from the audio load conveyor to one of the multiple audio testing jigs. In a second operative state, the audio load/unload robot transfers test device from one of the multiple audio testing jigs to the audio unload conveyor when test device passes testing of the audio functionalities inside the audio testing subsystem. In a third operative state, the audio load/unload robot, transfers test device from one of the multiple audio testing jigs to the audio reject conveyor when test device fails testing inside the audio testing subsystem. The audio load/unload robot, in these operative states, traverses in X-direction to load or unload test device inside the audio load/unload region, for example, before and after testing inside the audio subsystem. The audio load/unload is different from, and not the same as the audio robot, which is deployed in the audio box.

The present automated functional testing systems further, preferably, include an audio signal measurement subsystem that analyzes audio signals emanating during audio testing inside the audio box. The audio signal measurement subsystem is different from and not directly coupled to the test application controller. In this configuration, the audio signal measurement system is capable of controlling an audio robot controller independently of a test application controller, which is also designed to control the audio robot controller. Stated another way, the audio signal measurement subsystem, preferably, controls operation of the audio robot, independently of the test application controller, at certain times during testing of audio functionalities of the test device.

As implied above, the above-described automatic functional testing system may further include a test application controller that controls operation of an audio robot controller and that provides audio test applications to test audio functionalities of the test device. The audio robot controller may control operation of each of the audio load/unload robot, the audio robot and multiple audio testing shuttles.

The above-mentioned audio reject conveyor, preferably, extends in a direction that is perpendicular to a direction of extension of the audio load conveyor or of the audio unload conveyor. In preferred present arrangements, the audio load conveyor aligns with or is same as camera unload conveyor that is part of the camera testing subsystem.

The audio robot, preferably, includes two up/down cylinders, as end effectors, which in an operative state, displace in a Z-direction to be proximate to receiver and speaker of test device. In this configuration, each of the two up/down cylinders are disposed a separation distance, which ranges from about 5 mm to about 10 mm, away from a receiver or a speaker of the test device.

In yet another aspect, the present teachings provide another type of automated functional testing methods. One exemplar method includes: (i) determining or receiving information whether an audio jig is vacant, wherein the audio testing jig is present inside an audio testing subsystem; (ii) determining, using an audio load conveyor sensor, whether a test device is detected on an audio load conveyor; (ii) placing, using an audio load/unload robot, the test device on the vacant audio testing jig to produce an occupied audio testing jig, if the audio testing jig is deemed to be vacant, and if the test device is detected on the audio load conveyor; (iv) downloading, using a wireless connection and on the test device, one or more audio test applications stored on a test application controller; (v) testing, using one or more of the audio test applications in conjunction with an audio test robot, audio functionalities of the test device; (vi) generating an audio test result, which indicates whether the test device passed or failed the testing audio functionalities; (vii) conveying, using the audio load/unload robot, the test device present at the occupied audio testing jig to an audio unload conveyor, if the audio test result indicates that the test device passed the testing audio functionalities; and (viii) removing, using the audio load/unload robot, the test device from the occupied audio testing jig to an audio reject conveyor, if the audio test result indicates that the test device failed the testing audio functionalities.

After the testing of audio functionalities of the test device is successfully completed and passed, the audio test results are provided, preferably using a test application controller, to the audio load/unload robot. The audio load/unload robot removes the test device that has passed testing of the audio functionalities from the audio testing subsystem.

Each of the above-describe steps of conveying or removing may include: (i) moving an audio testing shuttle from an audio test region to an audio load/unload region, wherein the audio testing jig is secured on the audio testing shuttle; (ii) picking up, using the audio load/unload robot, the test device from the audio testing jig; and (iii) displacing the audio load/unload robot in the X-direction and away from the audio test region.

Testing audio functionalities of the test device include testing one functionality chosen from a group comprising front speaker functionality, front receiver functionality, rear speaker functionality, rear receiver functionality, ear phone functionality, ear phone microphone functionality, fun ear phone function key functionality, microphone functionality and vibrator functionality. By way of example for testing functionalities of front and rear speakers, and front and rear receivers, present functional testing methods include using two up/down cylinders that are disposed in Z-direction, proximate to a speaker and a receiver of the test device.

In yet another aspect, the present arrangements provide automatic robot control systems. One exemplar system includes: (i) a TSP robot controller; (ii) a camera robot controller; (iii) an audio robot controller; and (iv) a test application controller.

The camera robot controller is for controlling testing operations of the test device inside a camera testing subsystem. The audio robot controller is for controlling testing operations of the test device inside an audio testing subsystem. The test application controller has stored thereon TSP test applications, camera test applications and audio test applications.

The test application controller is bi-directionally coupled to each of the TSP robot controller, the camera robot controller, and the audio robot controller. In an operative state, the test application controller simultaneously tests: (i) TSP functionalities of test device, inside the TSP testing subsystem, using the TSP robot controller in conjunction with the TSP test applications, (ii) tests camera functionalities of test device, inside the camera testing subsystem, using the camera robot controller in conjunction with the camera test applications, and (iii) tests audio functionalities of test device, inside the audio testing subsystem, using the audio robot controller in conjunction with the audio test applications.

The TSP robot controller is bi-directionally coupled to the camera robot controller such that in an operative state of the TSP robot controller and the camera robot controller, the test device is automatically advanced from the TSP testing subsystem to the camera testing subsystem, when the test device passes TSP functionalities test inside the TSP subsystem.

Further, the camera robot controller is, similarly, bi-directionally coupled to the audio robot controller, such that in an operative state of the camera robot controller and the audio robot controller, the test device is automatically advanced from the camera testing subsystem to the audio testing subsystem, when the test device passes camera functionalities test inside the TSP subsystem.

In preferred embodiments, the present automatic robot control systems may further include: (i) a download robot controller for controlling testing operations of the test device present inside download testing subsystem; and (ii) a download test application controller configured to control the download robot controller. In this embodiment, the download robot controller is bi-directionally coupled to the TSP robot controller such that, when test device passes download functionalities test inside the download testing subsystem and in an operative state of the download robot controller and the TSP robot controller, the test device is automatically advanced from the download testing subsystem to the TSP testing subsystem. Further, the download robot controller controls operations of a download load/unload robot, a download application connector and a download testing shuttle present inside the download testing subsystem.

In preferred embodiments, the present automatic robot control systems may further include: an audio signals measurement system that is bi-directionally coupled to the audio robot controller and configured to receive and evaluate audio signals generated during audio functionalities test inside the audio testing subsystem. The audio signals measurement system, in an operative state, controls operations of the audio testing subsystem independent of the test application controller.

The TSP robot controller, preferably, controls operation of each of a TSP load/unload robot, a TSP robot, and a TSP testing shuttle inside the camera testing subsystem. The TSP robot controller, for example, controls displacement of the TSP load/unload robot in the X-direction. In those embodiments where the TSP robot includes a stylus end effector, the TSP robot controller controls displacement of the stylus end effector in X-, Y-, and Z-directions. The TSP robot controller, preferably, controls displacement of the TSP testing shuttle in the Y-direction.

The camera robot controller, preferably, controls operation of each of a camera load/unload robot, a camera robot, and a camera testing shuttle inside the camera testing subsystem. The camera robot controller, for example, controls displacement of the camera load/unload robot in the X-direction. In those embodiments, where the camera robot uses a two-axis robot, the camera robot controller controls displacement of the two-axis robot in the X-direction and the Z-direction. The camera robot controller, preferably controls displacement of the camera testing shuttle in the Y-direction.

The camera robot controller may also control non-linear displacement of a device holder and a camera testing jig (which is secured on the camera testing shuttle). By way of example, the camera robot controller controls rotational displacement of the device holder, by about 180° or about 360°, about a longitudinal axis that extends in X-direction. As another example, the robot controller controls rotational displacement of the camera testing jig about an axis that extends along Y-direction.

The audio robot controller, preferably, controls an audio load/unload robot, an audio robot, and an audio testing shuttle. The audio robot controller, for example, controls displacement of the audio load/unload robot in the X-direction. In those embodiments where the audio robot includes two up/down cylinders, the audio robot controller controls displacement of the two up/down cylinders in the Z-direction. The audio robot controller, preferably, controls displacement of the audio testing shuttle in the Y-direction.

In yet another aspect, the present arrangements provide automated functional testing system. One exemplar system includes: (i) a touch screen panel ("TSP") testing subsystem, which in an operative state, tests TSP functionalities of test device; (ii) a TSP robot facilitates launch, on the test device, of one or more of TSP test applications that are stored on a test application controller, and contacts predetermined contact regions on display screen of test device during a launched state of one or more of the TSP test applications on test device and thereby determines whether test device passes test of TSP functionalities; (iii) a TSP robot controller, which in an operative state, controls disposition of the TSP robot inside the TSP testing subsystem; (iv) a camera testing subsystem, which in an operative state, tests camera functionalities of test device and is disposed adjacent to the TSP testing subsystem; (v) a camera robot, which in an operative state, contacts predetermined contact regions on display screen, actuates keys and/or buttons, and/or stresses components of test device during a launched state of one or more of camera test applications on test device and thereby determines whether test device passes test of camera functionalities; (vi) a camera robot controller, which in an operative state, controls disposition of the camera robot inside the camera testing subsystem; (vii) an audio testing subsystem, which in an operative state, tests audio functionalities of test device; (viii) an audio robot, which in an operative state, actuates keys and/or buttons, probes or measures certain properties of components of test device that generate audio signals during a launched state of audio test applications on test device; (ix) an audio signal measurement system for measuring or quantifying the audio signals generated from test device and that operates in conjunction with launched one or more of the audio testing application to determine whether test device passes; (x) an audio robot controller, which in an operative state, and in conjunction with the audio signal measurement system, controls disposition of the audio robot; and (xi) a test application controller that, in an operative state, has stored thereon, conveys and launches the TSP testing application, the camera testing application, and the audio testing application.

The test application controller is, bi-directionally, coupled to each of the TSP robot controller, the camera robot controller, and the audio robot controller. The test application controller is further, bi-directionally, coupled, using a wireless connection, to test devices inside each of the TSP testing subsystem, the camera testing subsystem or the audio testing subsystem. This configuration allows for automatic and simultaneous testing of test devices in the TSP testing subsystem, the camera testing subsystem and the audio testing subsystem.

In preferred embodiments of the present arrangements, the automated functional testing system further includes a download testing subsystem for testing download functionalities of test device. The download testing subsystem has present therein a download robot, which is controlled by a download robot controller. This controller operates in conjunction with a download test application controller to determine whether test device passes test of download functionalities, and wherein the download test application controller has stored thereon one or more download test applications that are downloaded on test device to test download functionalities.

In yet another aspect, the present teachings provide automated methods for functional testing of test devices. One exemplar method includes: (i) loading, using a TSP load/unload robot, a test device present on a TSP conveyor to a TSP testing jig present in a TSP load/unload region of a TSP testing subsystem; (ii) displacing, using a TSP testing shuttle that has secured thereon the TSP testing jig, the test device from the TSP load/unload region to a TSP test region of the TSP testing subsystem; (iii) testing, using a TSP robot, TSP functionalities of the test device; (iv) displacing, using the TSP testing shuttle, the test device from the TSP test region to the TSP load/unload region; (v) conveying, using the TSP load/unload robot, the test device from the TSP testing jig to a TSP unload conveyor, if the test device passes the testing of TSP functionalities; (vi) removing, using the TSP load/unload robot, the test device from the TSP testing jig to a TSP reject conveyor, if the test device fails the testing of TSP functionalities; (vii) advancing the test device from the TSP unload conveyor to a camera load conveyor of a camera testing subsystem; (viii) loading, using a camera load/unload robot, a test device present on the camera load conveyor to a camera testing jig present in a camera load/unload region of the camera testing subsystem; (ix) displacing, using a camera testing shuttle that has secured thereon the camera testing jig, the test device from the camera load/unload region to a camera test region of the camera testing subsystem; (x) testing, using a camera robot, camera functionalities of the test device; (xi) displacing, using the camera testing shuttle, the test device from the camera test region to the camera load/unload region; (xii) conveying, using the camera load/unload robot, the test device from the camera testing jig to a camera unload conveyor, if the test device passes the testing of camera functionalities; (xiii) removing, using the camera load/unload robot, the test device from the camera testing jig to a camera reject conveyor, if the test device fails the testing of camera functionalities; (xiv) advancing the test device from the camera unload conveyor to an audio load conveyor of an audio testing subsystem: (xv) loading, using an audio load/unload robot, a test device present on the audio load conveyor to an audio testing jig present in an audio load/unload region of the audio testing subsystem: (xvi) displacing, using an audio testing shuttle that has secured thereon the audio testing jig, the test device from the audio load/unload region to a an audio test region of the audio testing subsystem: (xvii) testing, using an audio robot, audio functionalities of the test device displacing, using the audio testing shuffle, the test device from the audio test region to the audio load/unload region; (xix) conveying, using the audio load/unload robot, the test device from the audio testing jig to an audio unload conveyor, if the test device passes the testing of audio functionalities; and (xx) removing, using the audio load/unload robot, the test device from the audio testing jig to an audio reject conveyor, if the test device fails the testing of audio functionalities.

In preferred embodiments, the present automated methods for functional testing include: (i) loading, using a download load/unload robot, a test device present on a download conveyor to a download testing jig present in a download load/unload region of a download testing subsystem; (ii) displacing, using a download testing shuttle that has secured thereon the download testing jig, the test device from the download load/unload region to a download test region of the download testing subsystem; (iii) testing, using a download robot, download functionalities of the test device; (iv) displacing, using the download testing shuttle, the test device from the download test region to the download load/unload region; (v) conveying, using the download load/unload robot, the test device from the download testing jig to a download unload conveyor, if the test device passes the testing of download functionalities; (vi) removing, using the download load/unload robot, the test device from the download testing jig to a download reject conveyor, if the test device fails the testing of download functionalities; and (v) advancing the test device from the download unload conveyor to the TSP load conveyor.

In another aspect, the present teachings provide processes for automatic functional testing. One exemplar process includes: (i) loading, using a download loading/unloading robot, a test device on a download testing jig present inside a download testing subsystem; (ii) installing on the test device, using a download robot including a download test application connector, a wireless connection profile that enables a wireless connection between the test device and a test application controller; (iii) conveying, using the download loading/unloading robot and a touch screen panel ("TSP") loading/unloading robot, the test device from the download testing subsystem to a TSP testing subsystem; (iv) launching, using the test application controller, the wireless connection profile on the test device present inside the TSP testing subsystem to establish a wireless connection between the test device and the test application controller; and (v) retrieving, using the wireless connection, from the test device a device identification code of the test device. A communications network, such as the Global Systems for Mobile Communications ("GSM") network, uses the device identification code (i.e., International Mobile Equipment Identity ("IMEI") number) to identify the test device and to cease unauthorized use of the test device in an operational state.

Preferred embodiments of the present automated functional testing methods include introducing, using a TSP robot, a TSP test application connector inside a test application receiving port on the test device to form a TSP test application connection. In this embodiment, the above-described launching step includes using the TSP test application connection in conjunction with the test application controller and the step of introducing is carried out before the step of launching is carried out.

In those instances where an operating system is not downloaded on to the device prior to the above-described installing step, the present automated functional testing methods, preferably, further include downloading, using the download test application connector, on the test device one or more download test applications (which are different from the wireless connection profile) and/or an operating system. Both the operating system and download testing applications are stored on a download test application controller, which is different from the test application controller. Further, the download unload/load robot is different from the download robot. If the above-described downloading step is performed, it is performed before or at the same time as the above-described installing step is carried out.

In preferred embodiments of the present teachings, the present automated functional testing methods include storing the device identification code on the test application controller. This allows tracking results of different types of functional testing for a particular test device to be associated with the device identification code of that test device. By way of example, the present automated functional testing methods includes; (i) testing, using a TSP robot, TSP functionalities of the test device; (ii) obtaining, using the test application controller, TSP test results of the test device generated from testing of TSP functionalities; and (iii) associating and storing, using the test application controller, the TSP test results of the test device with the device identification code of the test device.

As another example, the present automated functional testing methods includes: (i) testing, using a camera robot, camera functionalities of the test device; (ii) obtaining, using the test application controller, camera test results of the test device generated from testing of camera functionalities; and (iii) associating and storing, using the test application controller, the camera test results of the test device with the device identification code of the test device.

As yet another example, the present automated functional testing methods includes: (i) testing, using an audio robot, audio functionalities of the test device; (ii) obtaining, using the test application controller, audio test results of the test device generated from testing of audio functionalities; and (iii) associating and storing, using the test application controller, the audio test results of the test device with the device identification code of the test device.

The system and method of operation of the present teachings and arrangements, however, together with additional objects and advantages thereof, will be best understood from the following descriptions of specific embodiments when read in connection with the accompanying figures.

DETAILED DESCRIPTION

In the following description, numerous specific details are set forth in order to provide a thorough understanding of the present invention. It will be apparent, however, to one skilled in the art that the present invention may be practiced without limitation to some or all of these specific details. In other instances, well-known process steps have not been described in detail in order to not unnecessarily obscure the invention. For example, the present teachings recognize that for certain determinations, such as determining whether a test jig is vacant, an appropriate sensors may be used.

Figure 1A:
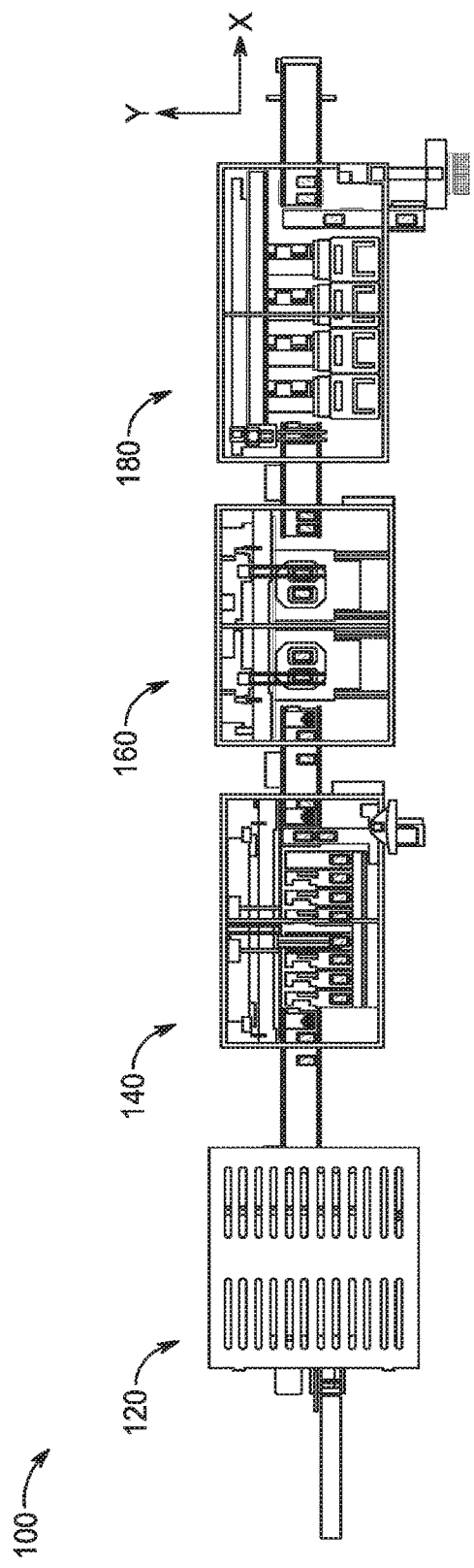
FIG. 1A shows a top view of an automated functional testing system, according to one embodiment of the present arrangements and that is used for automatically testing various functionalities of test devices.
Figure 1B:
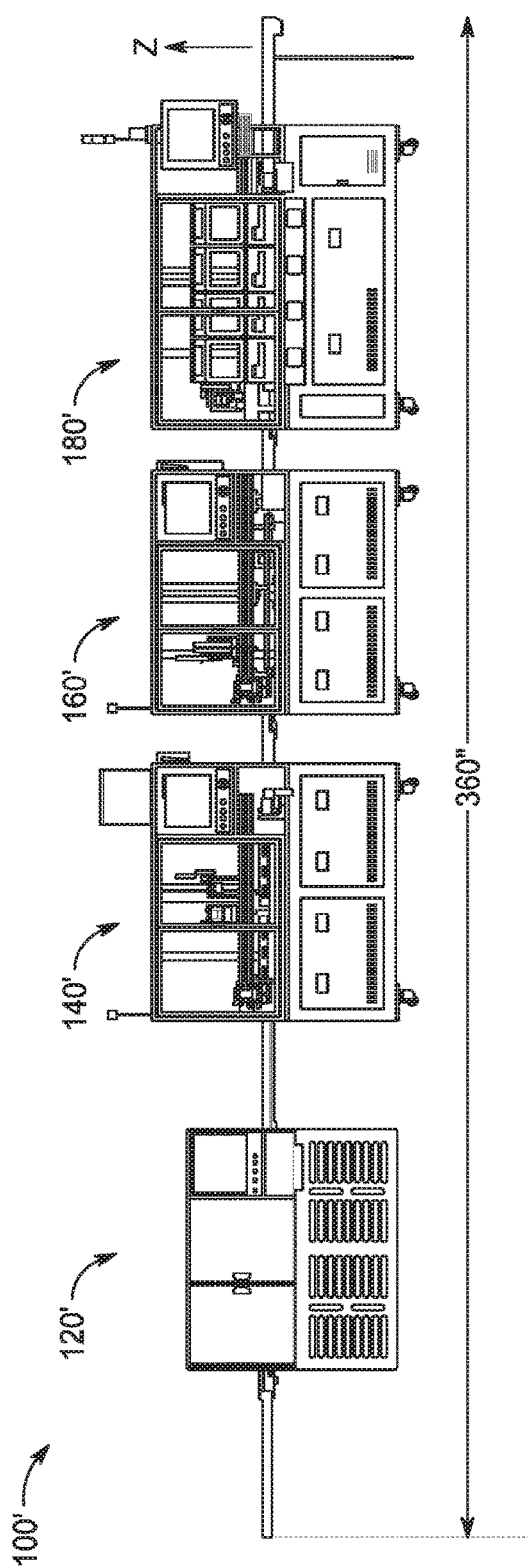
FIG. 1B shows a side view of the automated functional testing system shown in FIG. 1A.

FIG. 1A shows a top view of an automated functional testing system 100, according to one embodiment of the present arrangements and that is designed to automatically test various functions performed by test devices. In this embodiment, automatic functional testing system 100 includes a download testing subsystem 120, a touch screen panel ("TSP") testing subsystem 140, a camera testing subsystem 160 and an audio testing subsystem 180. FIG. 1B shows an automated functional testing system 100', which is a side view of the automated functional testing system 100 shown in FIG. 1A. Automated functional testing system 100' includes a download testing subsystem 120', a TSP testing subsystem 140', a camera testing subsystem 160' and an audio testing subsystem 180' that are similar to their counterparts, i.e., download testing subsystem 120, TSP testing subsystem 140, camera testing subsystem 160 and audio testing subsystem 180, of FIG. 1B.

Download testing subsystem 120 is designed to test the downloading functionalities of the test device. Examples of such functionalities include application downloading functionalities, applications installing functionalities, wireless connection profile installing functionalities and battery operations-related functionalities. In preferred embodiments of the present teachings, during testing of download functionalities, a wireless connection (e.g., WiFi®) connection profile installing functionality is tested as an example of testing wireless connection profile installing functionalities.

Figure 2A:
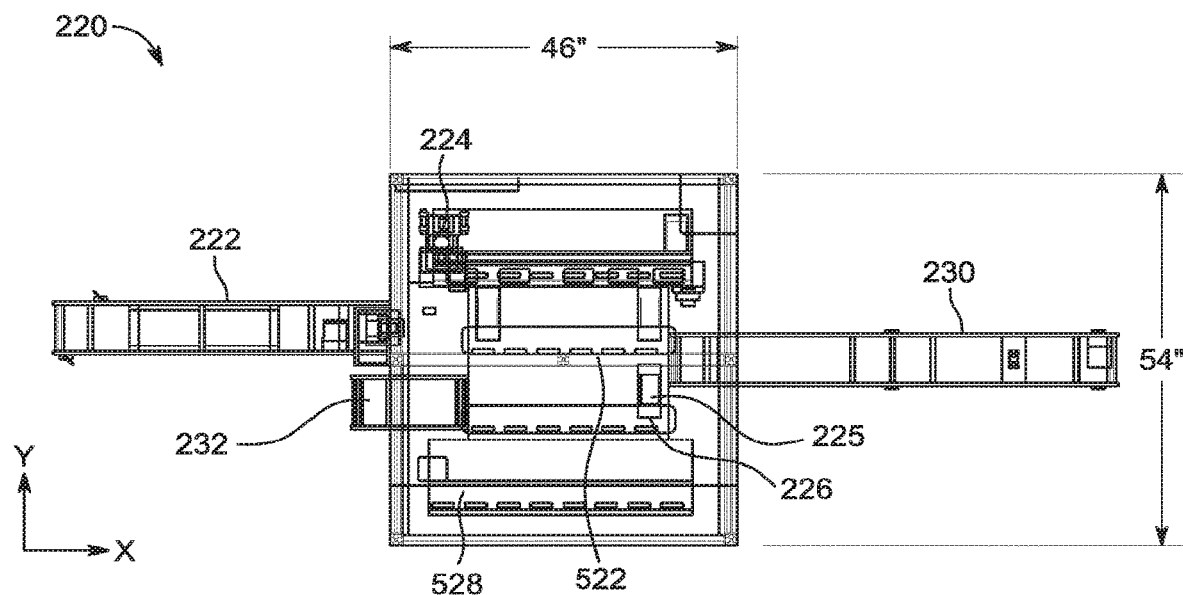
FIG. 2A shows a top view, without a top cover, of a download testing subsystem, according to one embodiment of the present arrangements and that is incorporated into the automated functional testing system of FIG. 1A.

TSP testing subsystem 140 is designed to test the touch screen panel ("TSP") functionalities of a test device. During TSP functionalities testing, a TSP robot contacts different regions, preferably predetermined contact regions, of a display screen of the test device when at least one of the following is occurring: one or more program applications are being installed on the test device; one or more program applications are being launched on the test device; a "without-axis" operation is being performed or managed on the test device; an operation that involves a wireless connection (e.g., WiFi® connection) is being performed or managed on the test device; an operation using short wavelength radio waves (e.g., Bluetooth®) is being performed or managed on the test device; a geometric sensor operation is being performed or managed on the test device; a charging operation is being performed or managed on the test device, when a "with-axis" operation is being performed or managed on the test device; when a touch screen panel is operating on the test device; a 3D touch operation is being performed or managed on a test device; or an advanced touch operation is being performed or managed on a test device. The term "with-axis," as it is used herein, conveys that during a test, linear movement of the test components (e.g., test robots) is required in an X-, Y- or Z-directions. FIGS. 1A and 2A show the X-direction and Y-direction and FIG. 1B shows the Z-direction of movement. On the other hand, "without-axis" conveys that during a test, linear movement of the testing components in the X-, Y- or Z-directions is not required. Examples of "without-axis" tests include operations using a wireless connection (e.g., WiFi®) test or using short wavelength radio waves Bluetooth®, because during these tests, a short distance digital and/or power communication (e.g., USB) cable connection is used without requiring any linear movement.

Camera testing subsystem 160 is designed to test the camera functionalities of a test device. During camera functionalities test, a camera robot is designed to contact a certain region or button on the test device and/or cover a sensor of the test device when at least one of the following is occurring: camera components operate in connection with "with-axis" functionalities of the test device; a proximity sensor is operating or being managed on the test device; a light sensor is operating or being managed on the test device; a side key is operating or being managed on the test device; an accelerator sensor is operating or being managed on the test device; a rear camera or rear video camera is operating or being managed on the test device; or a front camera or front video camera is operating or being managed on the test device.

Audio testing subsystem 180 is designed to test the audio functionalities of the test device. During audio testing, an audio robot tests functionalities of audio components of the test device when at least one of the following is occurring: a "with-axis" operation is being performed or managed on the test device; a front speaker is operating or being managed on the test device; a front receiver is operating or being managed on the test device; a rear phone speaker is operating or being managed on the test device; an ear phone microphone is operating or being managed on the test device; an ear phone function key is operating or being managed on the test device; a microphone is operating or being managed on the test device; or a vibrator is operating or being managed on the test device.

FIG. 2A shows, in greater detail, a top view of a download testing subsystem 220, which is substantially similar to download testing subsystem 120 of FIG. 1A. As shown in FIG. 2A, download testing subsystem 220 includes a download load conveyor 222, a download testing jig 226, a download shuttle 228, a download load/unload robot 224, and a download unload conveyor 230. In this configuration, multiple download testing jigs are disposed between download load conveyor 222 and download unload conveyor 230, allowing for relatively higher throughput values of processed test devices, i.e., test devices that have undergone download or some other type of testing described herein, for the present systems and methods than those realized by conventional testing methods.

Although not necessary, download testing subsystem 220 may have defined therein a download loading/unloading region 522 and a download testing region 528. Arrangement of such regions also contributes to realization of higher throughput values, of processed test devices, for the present systems and methods than those realized by conventional testing methods. In the present arrangements, a download load/unload robot 224, preferably, displaces in the X-direction and rapidly loads test devices (e.g., one test device 225 at a time) from download load conveyor 222 to download loading/unloading region 522. Before download testing commences, however, download shuttle 228 displaces download testing jig 226 in the Y-direction. With test device 225 secured thereon, download testing jig 226 may specifically displace from download loading/unloading region 522 to download testing region 528, where download testing on test device 225 is carried out. After download testing is complete, download shuttle 228, preferably, facilitates return of download testing jig 226 from download testing region 528 to download loading/unloading region 522. From there, test device 225, depending on its download test results, are disposed. By way of example, if test device 225 passes the download test, then download load/unload robot 224 advances test device 225 from download loading/ unloading region 522 to download unload conveyor 230 for further testing.

In certain embodiments of the present arrangements, a download reject conveyor 232 is provided to remove, from download testing subsystem 220, test devices that fail download testing. In preferred embodiments of these arrangements, download reject conveyor 232 extends substantially parallel to download unload conveyor 230. If test device 225 fails the download test, then download load/unload robot 224 conveys test device 225 from download loading/unloading region 522 to download reject conveyor 232, which carries it to a reject box that may be an external attachment of download testing subsystem 220. Test devices in reject box may undergo repair to fix one or more of the defects identified during download testing.

Figure 2B:
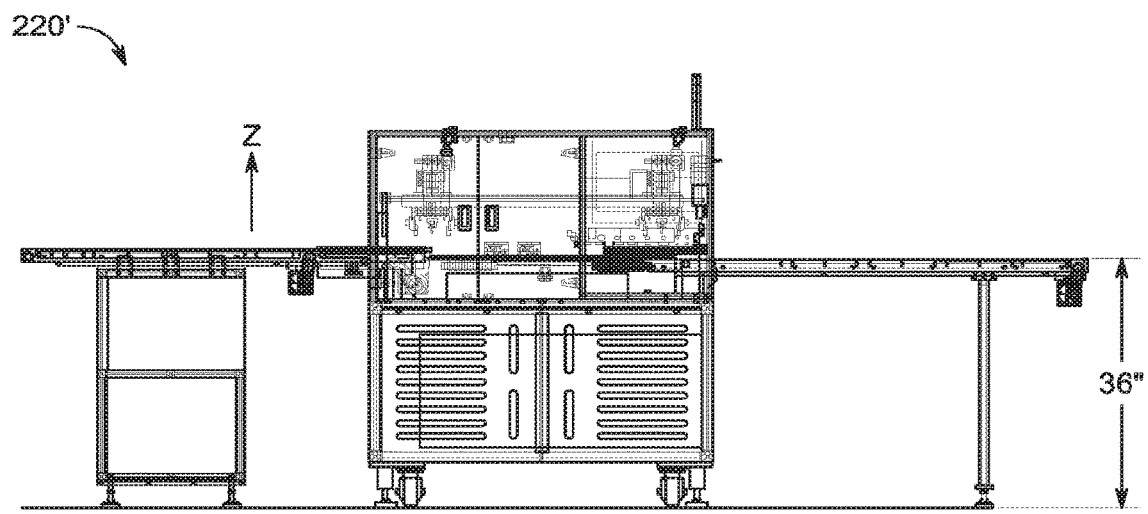
FIG. 2B shows a side view of the download testing system of FIG. 2A.

FIG. 2B shows a side view of a download testing subsystem 220', which is substantially similar to download testing subsystem 220 shown in FIG. 2A. According to FIG. 2A, download testing subsystem 220 is arranged to have a relatively compact footprint that provides high throughput values for processed test devices. By way of example, a width of download testing subsystem 220 is a value that ranges from about 40 inches to about 50 inches, and is preferably about 46 inches. A depth of download testing subsystem 220 may be a value that ranges from about 50 inches to about 60 inches, and may, preferably, be about 54 inches. FIG. 2B shows that a height of download testing subsystem 220' is a value that ranges from about 60 inches to about 70 inches, and is preferably about 63 inches.

Figure 3A:
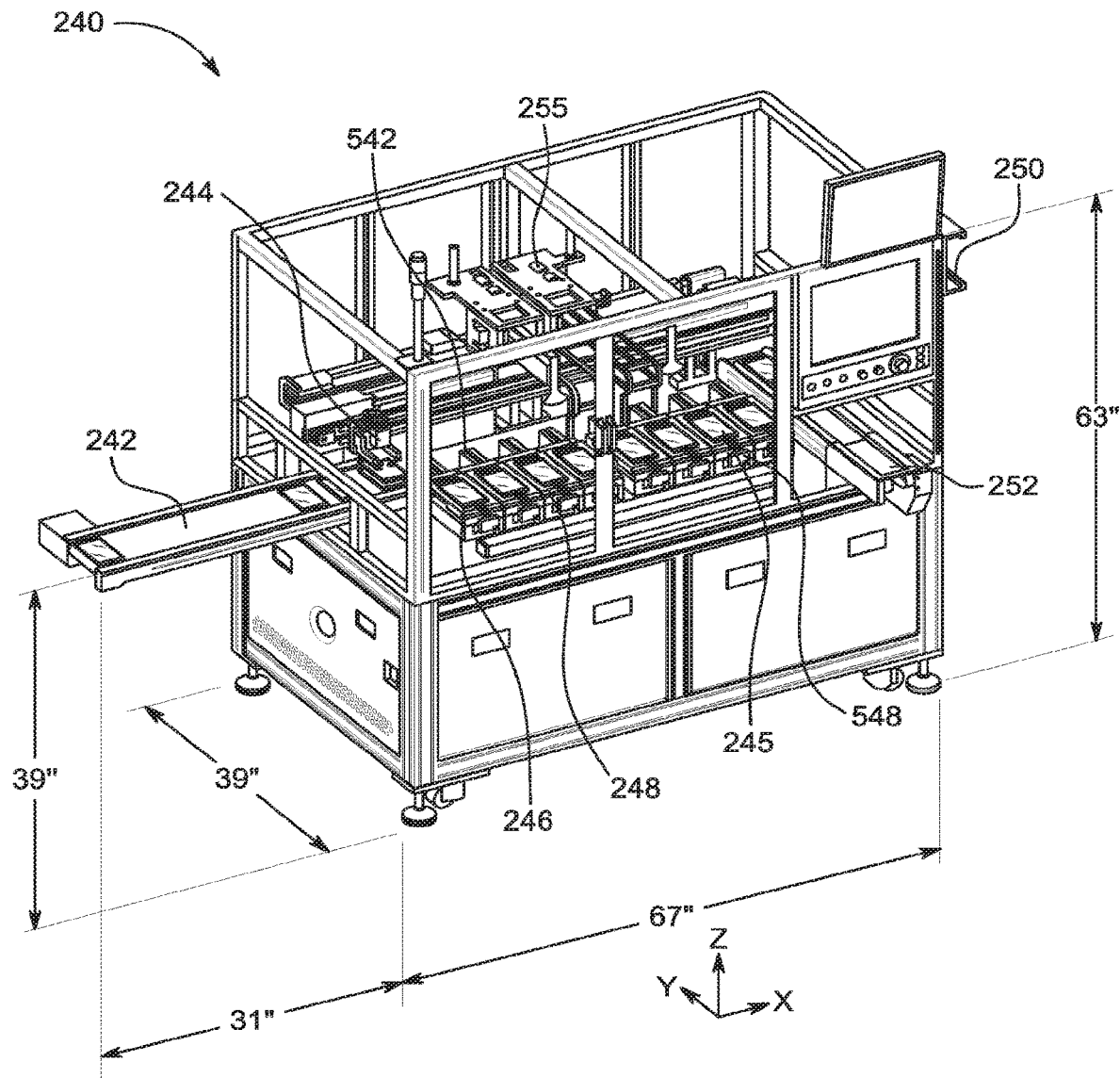
FIG. 3A shows a top perspective view of a TSP testing subsystem, according to one embodiment of the present arrangements and that is incorporated into the automated functional testing system of FIG. 1A.

FIG. 3A shows a TSP testing subsystem 240, which is substantially similar to TSP testing subsystem 140 shown in FIG. 1A and that tests TSP functionalities of a test device 245. As shown in FIG. 3A, TSP testing subsystem 240 includes, among other components, a TSP load conveyor 242, a TSP testing jig 246 that displaces in the Y-direction with the help of a TSP shuttle 248, a TSP load/unload robot 244, a TSP unload conveyor 250, a TSP reject conveyor 252, and a TSP robot 255. Of these components, TSP load conveyor 242, TSP load/unload robot 244, TSP testing jig 246, TSP shuttle 248, TSP unload conveyor 250, TSP reject conveyor 252 are substantially similar to their counterparts, i.e., download load conveyor 222, download load/unload robot 224, download testing jig 226, download shuttle 228, download unload conveyor 230, download reject conveyor 232, shown in FIG. 2A. TSP robot 255 is described in connection with FIG. 3C in detail below.

Inside TSP testing subsystem 240 shown in FIG. 3A, and similar to download testing subsystem 220 shown in FIG. 2A, multiple TSP testing jigs 246 are disposed between TSP load conveyor 242 and TSP unload conveyor 250, allowing for relatively higher throughput values of TSP tested devices, i.e., test devices that have undergone TSP testing as described herein, for the present systems and methods than those realized by conventional testing methods.

Figure 3B:
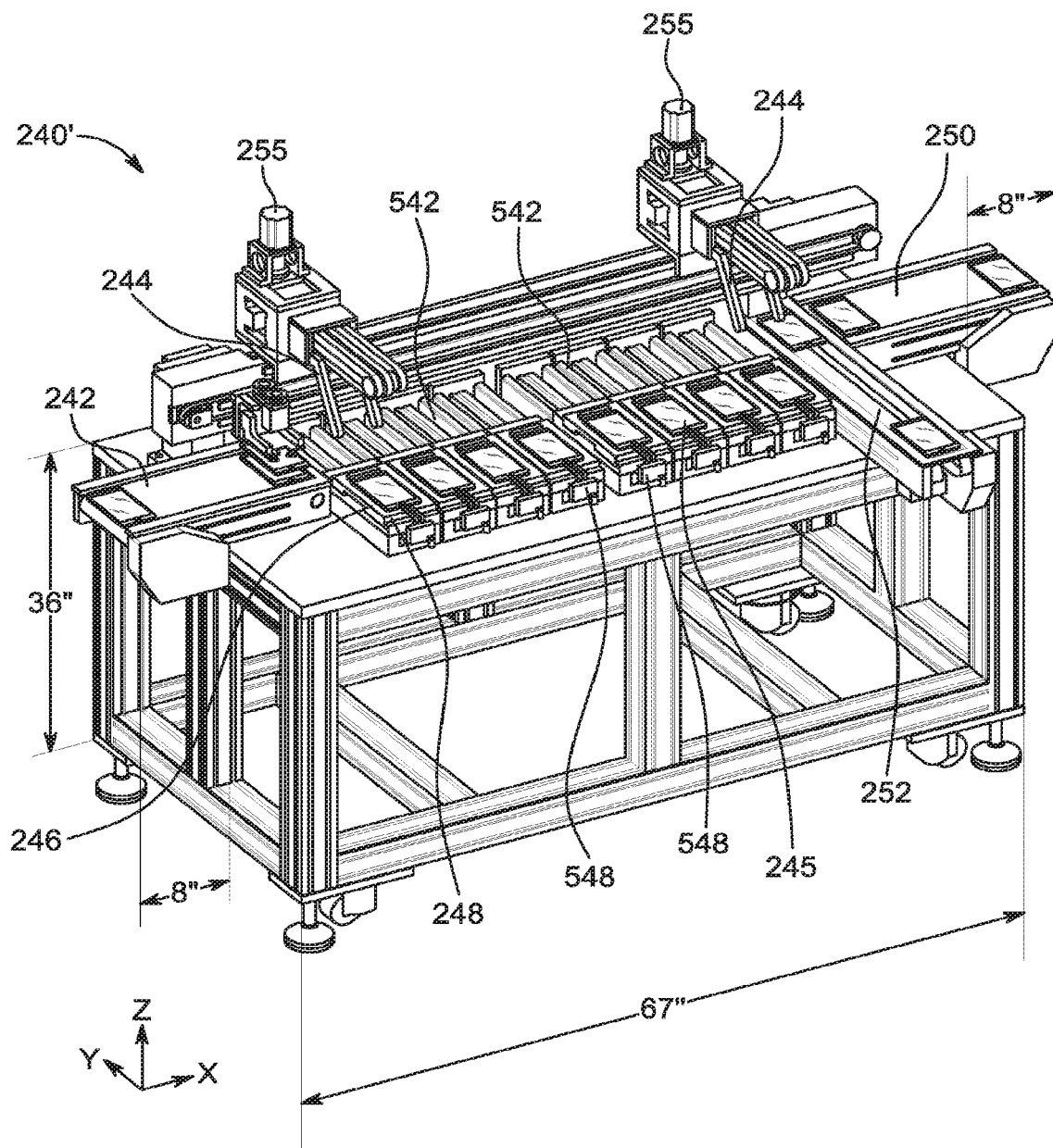
FIG. 3B shows a top perspective view of the TSP testing subsystem shown in FIG. 3A and that does not include a cover to expose certain salient components involved in conveyance of test devices.

FIG. 3B shows a TSP testing subsystem 240', which is substantially similar to TSP testing subsystem 240 of FIG. 3A, except that TSP testing subsystem 240', without covers is exposed and shows, in greater detail, salient components responsible for conveying test device 245 in, out of and inside TSP testing subsystem 240'. The components responsible for conveyance, inside TSP testing subsystem 240 or 240', of test device 245 include TSP shuttle 248, TSP load/unload robot 244, a TSP unload conveyor 250, and a TSP reject conveyor 252.

Although not necessary, TSP testing subsystem 240 may have defined therein a TSP loading/unloading region 542 and a TSP testing region 548. Arrangement of such regions contributes to realization of higher throughput values of test devices that undergo TSP testing. In the present arrangements, a TSP load/unload robot 244, preferably, displaces in the X-direction and rapidly loads, one test device 225 at a time, from TSP load conveyor 242 to TSP loading/unloading region 542. Before TSP testing commences, however, TSP shuttle 248 displaces TSP testing jig 246 in the Y-direction. With test device 245 secured thereon and with the help of TSP shuttle 248, TSP testing jig 246 may specifically displace from TSP loading/unloading region 542 to TSP test region 548, where TSP testing on test device 245 is carried out. After TSP testing is complete, TSP shuttle 248, preferably, facilitates return of TSP testing jig 246 from TSP test region 548 to TSP loading/unloading region 542. From there, test device 245, depending on its TSP test results, are disposed. By way of example, if test device 245 passes the TSP test, then TSP load/unload robot 244 advances test device 245 from TSP loading/unloading region 542 to TSP unload conveyor 250 for further testing.

In certain embodiments of the present arrangements, a TSP reject conveyor 252 is provided to remove, from TSP testing subsystem 240, test devices that fail TSP testing. In preferred embodiments of these arrangements, TSP reject conveyor 252 extends substantially perpendicular to TSP unload conveyor 250. If test device 245 fails the TSP test, then TSP load/unload robot 244 conveys test device 245 from TSP loading/unloading region 542 to TSP reject conveyor 252, which carries it to a reject box that may be an external attachment of TSP testing subsystem 240. Test devices in reject box may undergo repair to fix one or more of the defects identified during TSP testing.

FIGS. 3A and 3B show that TSP testing subsystem 240 and 240' is arranged to have a relatively compact footprint that provides high throughput values for the processed test devices. An exemplar width of TSP testing subsystem 240 is a value that ranges from about 60 inches to about 70 inches, and is preferably about 67 inches, as shown in FIGS. 3A and 3B. Width of TSP testing subsystem 240 may be extended on each side by a presence of a conveyor. To this end, FIG. 3B shows that each of TSP load conveyor 242 and TSP unload conveyor 250 may be about 8 inches wide. FIG. 3A shows that a height of TSP testing subsystem 240 is a value that ranges from about 60 inches to about 70 inches, and is preferably about 63 inches. FIG. 3A also shows a depth of TSP testing subsystem 240 may be a value that ranges from about 35 inches to about 45 inches, and may, preferably, be about 39 inches.

Figure 3C:
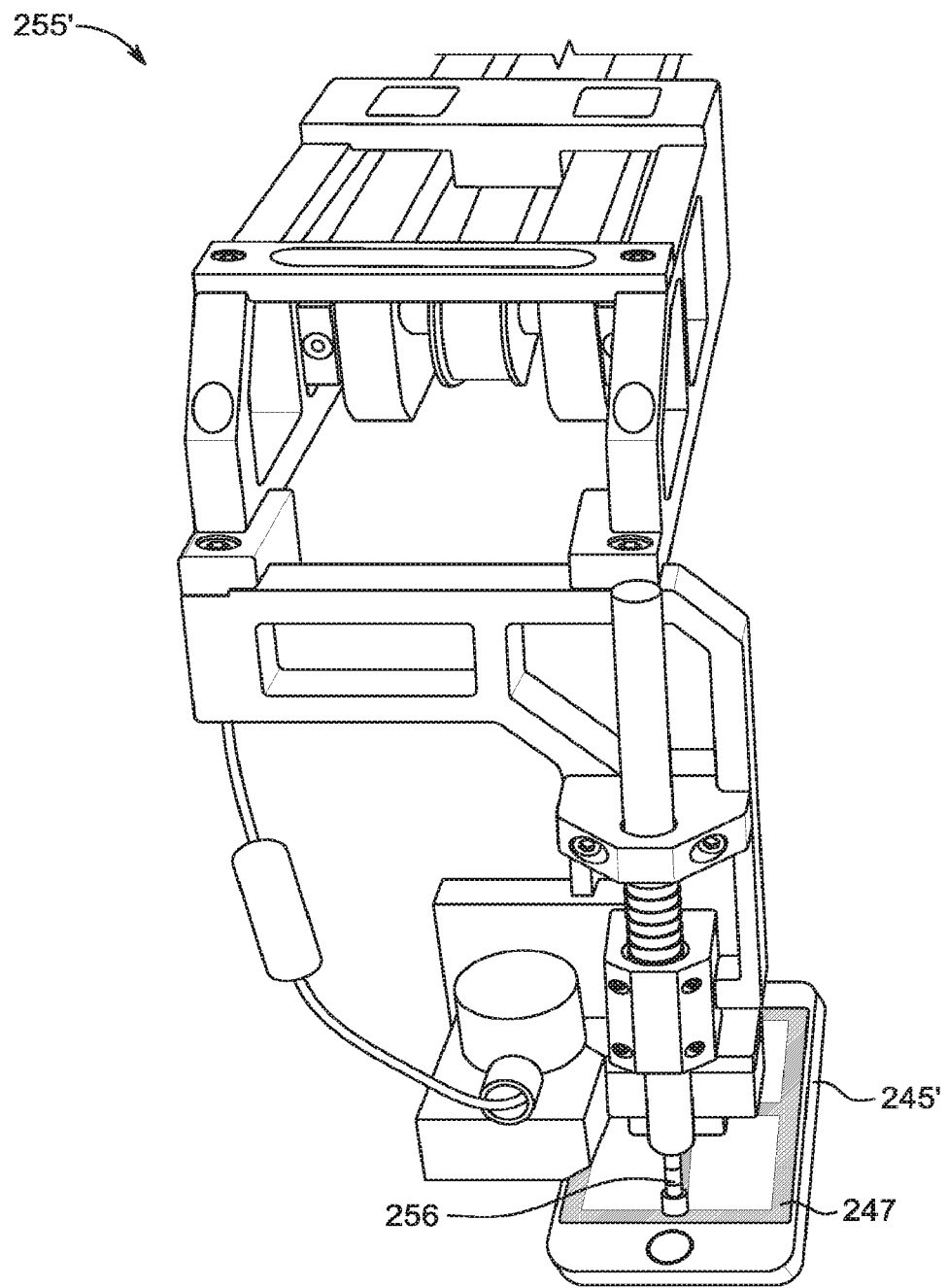
FIG. 3C shows a top perspective view of a TSP robot, according to one embodiment of the present arrangements and that operates inside the TSP testing subsystem shown in FIG. 3A.
Figure 3D:
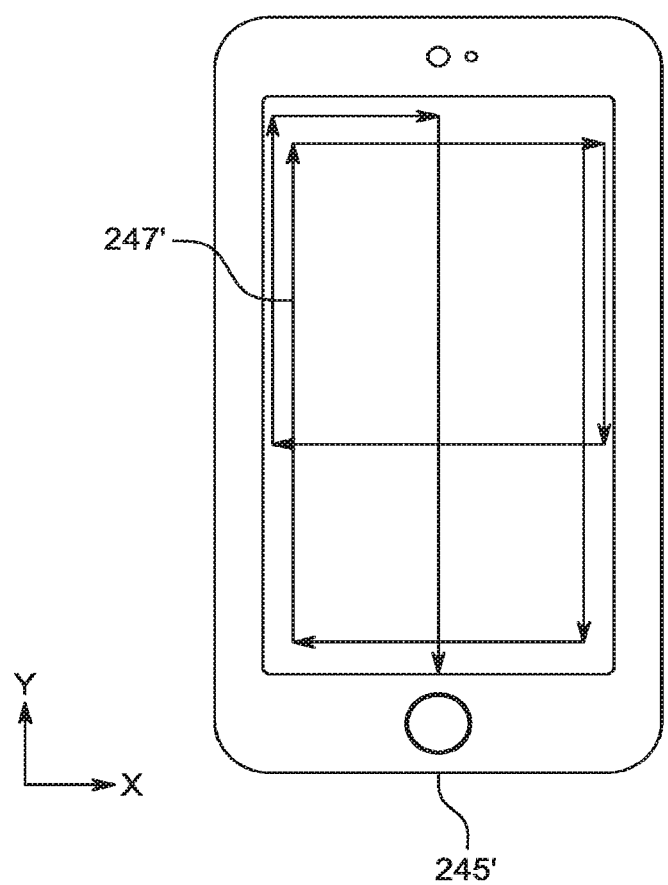
FIG. 3D shows a front view of a test device bearing a pattern, according to one embodiment of the present teachings and that is drawn by a stylus end effector of the TSP robot shown in FIG. 3B.

FIG. 3C shows a TSP robot 255', which is substantially similar to TSP robot 255 shown in FIG. 3A, except TSP robot 255' shows a stylus end effector 256 in greater detail. During TSP testing, stylus end effector 256 contacts predetermined contact regions of a display screen of test device 245', which is substantially similar to test device 245 of FIG. 3B, except test device 245' is in a state of undergoing TSP testing. For testing one or more TSP functionalities, stylus end effector 256 of FIG. 3C draws a pattern on a display screen of test device 245'. FIG. 3D clearly shows an exemplar pattern 247 that is created by displacing stylus end effector 256 of FIG. 3C in X- and Y-directions, as the stylus end effector contacts the display screen of test device 245'.

In an automated implementation of TSP testing subsystem 240, one or more TSP test applications are provided to test device 245'. Preferably, these TSP test applications, among other types of test applications (e.g., download test applications, camera test applications and audio test applications), are stored in a test application controller (e.g., test application controller 1508 shown in FIG. 15). Prior to TSP testing using stylus end effector 256 of FIG. 3C, one or more of TSP test applications are downloaded, installed and launched on test device 245'. Although this may be accomplished in many number of ways, in one preferred implementation, TSP testing jig 246 comes equipped with a TSP test application connector (e.g., test application connector 1502 shown in FIG. 15) that communicatively couples to a connection port on test device 245' and establishes a short-distance digital data communication and/or power connection (e.g., a USB connection).

Regardless of the manner in which TSP test applications are downloaded, installed and launched on test device 245', testing by stylus end effector 256 of FIG. 3C is accompanied when these TSP test applications are active on test device 245'. If an appropriate test application is launched on test device 245' to enable a wireless connection (e.g., WiFi® connection) between test device 245' and test application controller (e.g., test application connector 1502 shown in FIG. 15), then results of the stylus testing obtained from test device 245' may be conveyed, through the established wireless (e.g., WiFi® connection), to the test application controller.

Figure 4A:
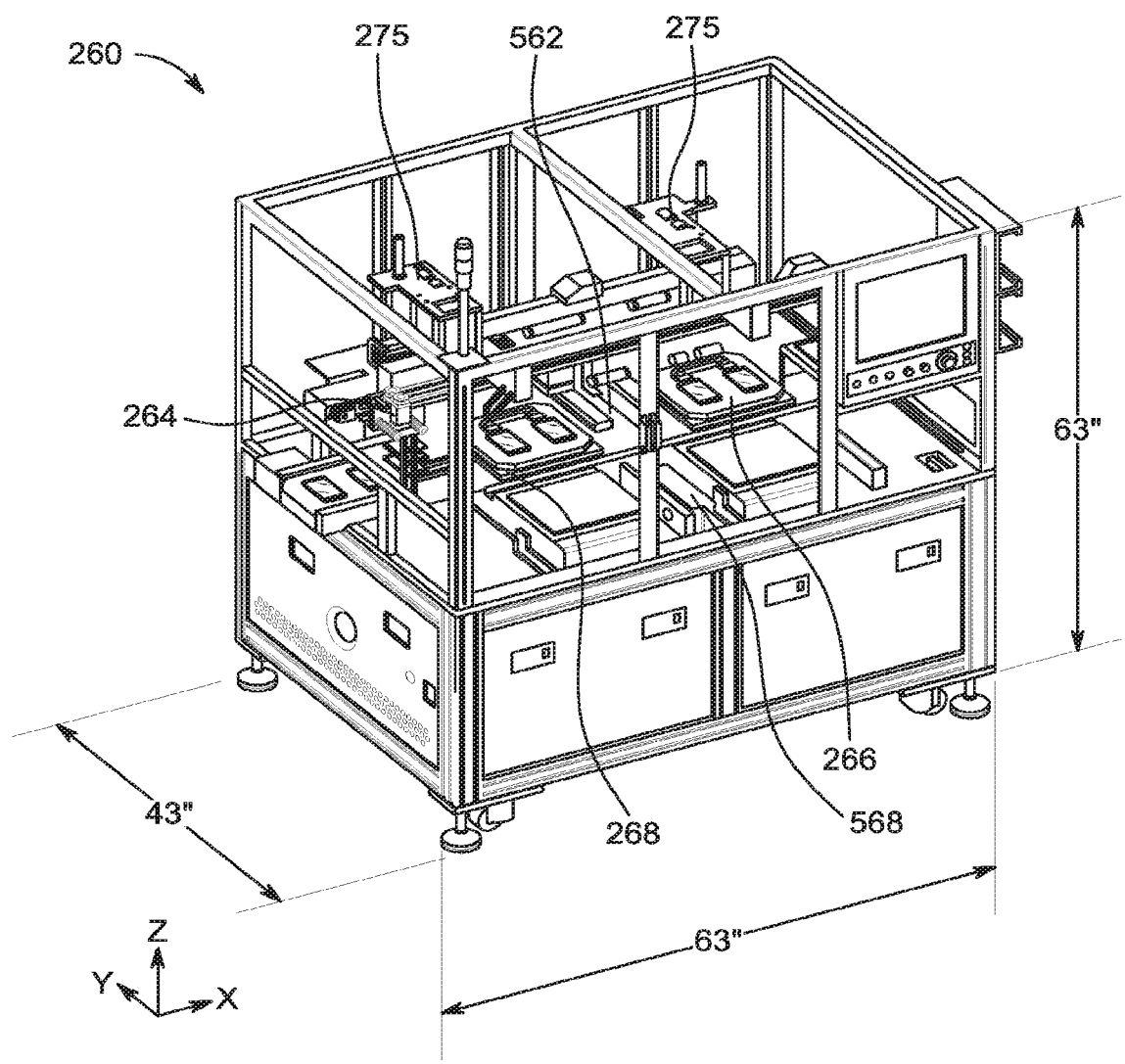
FIG. 4A shows a top perspective view of a camera testing subsystem, according to one embodiment of the present arrangements and that is incorporated into the automated functional testing system of FIG. 1A.
Figure 4B:
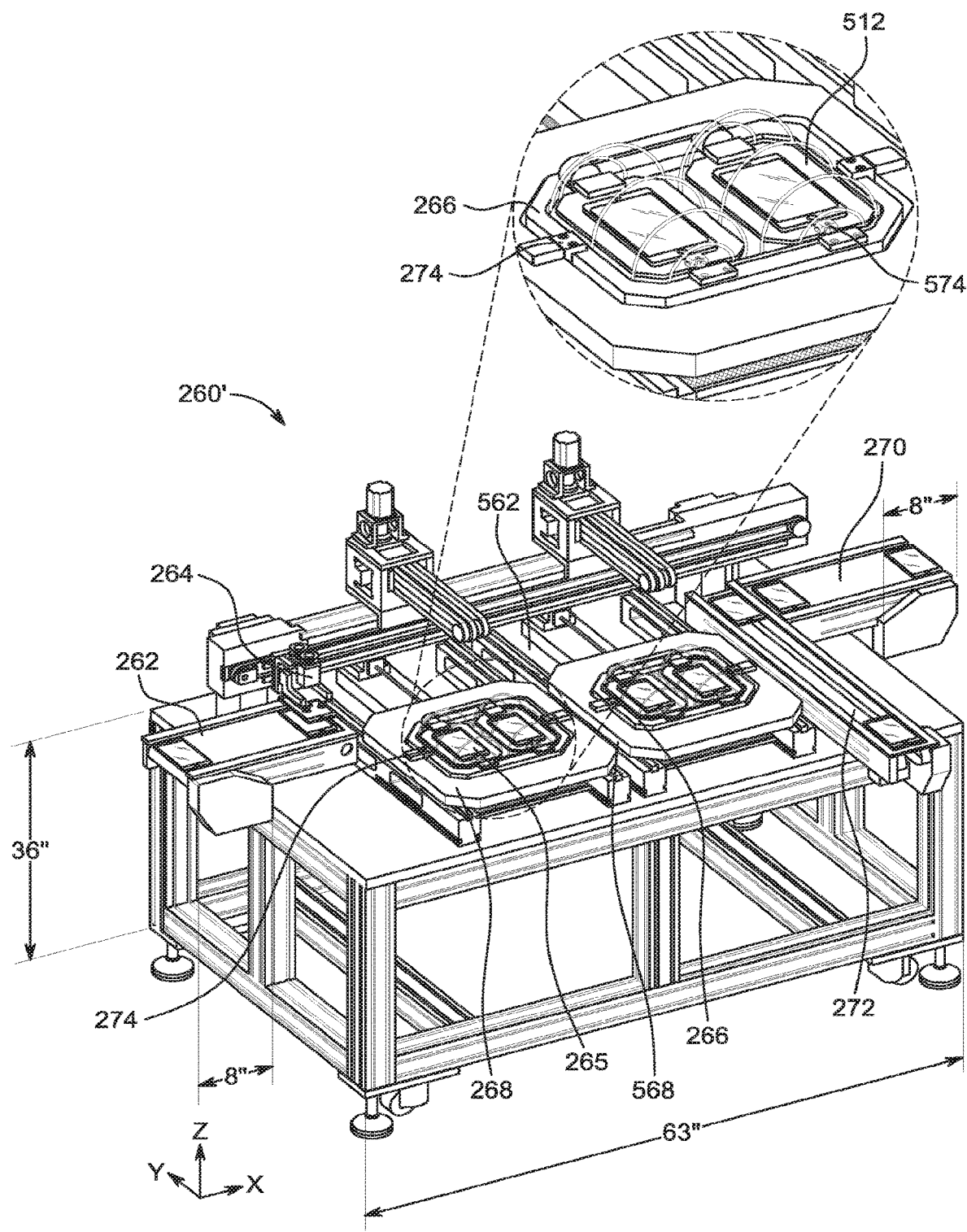
FIG. 4B shows a top perspective view of the camera testing subsystem shown in FIG. 4A and that does not include a cover to expose certain salient components involved in conveyance of test devices.

FIG. 4A shows a camera testing subsystem 260, which is substantially similar to camera testing subsystem 160 shown in FIG. 1A and that tests camera functionalities of a test device 265 (shown in FIG. 4B). As shown in FIG. 4A, camera testing subsystem 260 includes, among other components, a camera load conveyor 262, a camera testing jig 266 that displaces with the help of a camera testing shuttle 268 in the Y-direction, a camera load/unload robot 264, a camera unload conveyor 270, a camera reject conveyor 272, and a camera robot 275. Of these components, camera load conveyor 262, camera load/unload robot 264, camera testing jig 266, camera testing shuttle 268, camera unload conveyor 270, camera reject conveyor 272 are substantially similar to their counterparts, i.e., TSP load conveyor 242, TSP load/unload robot 244, TSP testing jig 246, TSP shuttle 248, TSP unload conveyor 250, TSP reject conveyor 252, shown in FIG. 3A. Camera robot 275 is described in connection with FIG. 4C in detail below.

Inside camera testing subsystem 260 shown in FIG. 4A, and similar to TSP testing subsystem 240 shown in FIG. 3A, multiple camera testing jigs 266 are disposed between camera load conveyor 262 and camera unload conveyor 270, allowing for relatively higher throughput values of processed test devices for the present systems and methods than those realized by conventional testing methods. In this case, the processed test devices have passed the test of camera functionalities.

FIG. 4B shows a camera testing subsystem 260', which is substantially similar to camera testing subsystem 260 of FIG. 4A, except that camera testing subsystem 260', without covers is exposed and shows, in greater detail, salient components responsible for conveying test device 265 in, out of and inside camera testing subsystem 260'. The components responsible for conveyance, inside camera testing subsystem 260 or 260', of test device 265 include camera testing shuttle 268, camera load/unload robot 264, a camera unload conveyor 270, and camera reject conveyor 272. FIG. 4B shows other components, such as a positioner 274 and a turn cylinder 574, that do not participate in conveyance of test device 265 from one point to another, but do contribute to movement of test device 265 during camera testing. Positioner 274 includes a rotatable pin type connection disposed between camera testing shuttle 268 and camera testing jig 266, and turn cylinder 574 is another rotatable pin type connection disposed between camera testing jig 266 and a device holder 512. The different types of movements effected by positioner 274 and turn cylinder 574 are described in greater detail in connection with FIGS. 4D and 4E below.

Although not necessary, camera testing subsystem 260 may have defined therein a camera loading/unloading region 562 and a camera testing region 568. Arrangement of such regions contribute to realization of higher throughput values of test devices that undergo camera testing. In the present arrangements, a camera load/unload robot 264, preferably, displaces in the X-direction and rapidly loads, one test device 265 at a time, from camera load conveyor 262 to camera loading/unloading region 562. Before camera testing commences, however, camera testing shuttle 268 displaces camera testing jig 266 in the Y-direction. With test device 265 secured thereon and with the help of camera testing shuttle 268, camera testing jig 266 may specifically displace from camera loading/unloading region 562 to camera test region 568, where camera testing on test device 265 is carried out. After camera testing is complete, camera test shuttle 268, preferably, facilitates return of camera testing jig 266 from camera test region 568 to camera loading/unloading region 562. From there and depending on its camera test results, test device 265 is disposed. By way of example, if test device 265 passes the camera test, then camera load/unload robot 264 advances test device 265 from camera loading/unloading region 562 to camera unload conveyor 270 for further testing.

In certain embodiments of the present arrangements, a camera reject conveyor 272 is provided to remove, from camera testing subsystem 260, test devices that fail camera testing. In preferred embodiments of these arrangements, camera reject conveyor 272 extends substantially perpendicular to camera unload conveyor 270. If test device 265 fails the camera test, then camera load/unload robot 264 conveys test device 265 from camera loading/unloading region 562 to camera reject conveyor 272, which carries it to a reject box that may be an external attachment of camera testing subsystem 260. Test devices in reject box may undergo repair to fix one or more of the defects identified during camera testing.

FIGS. 4A and 4B show that camera testing subsystem 260 and 260' is arranged to have a relatively compact footprint that provides high throughput values for the processed test devices. An exemplar width of camera testing subsystem 260 is a value that ranges from about 60 inches to about 70 inches, and is preferably about 63 inches, as shown in FIGS. 4A and 4B. Width of camera testing subsystem 260 may be extended on each side by a presence of a conveyor. To this end, FIG. 4B shows that each of camera load conveyor 262 and camera unload conveyor 270 may be about 8 inches wide. FIG. 4A shows that a height of camera testing subsystem 260 is a value that ranges from about 60 inches to about 70 inches, and is preferably about 63 inches. FIG. 4A also shows a depth of camera testing subsystem 260 may be a value that ranges from about 40 inches to about 50 inches, and may, preferably, be about 43 inches.

Figure 4C:
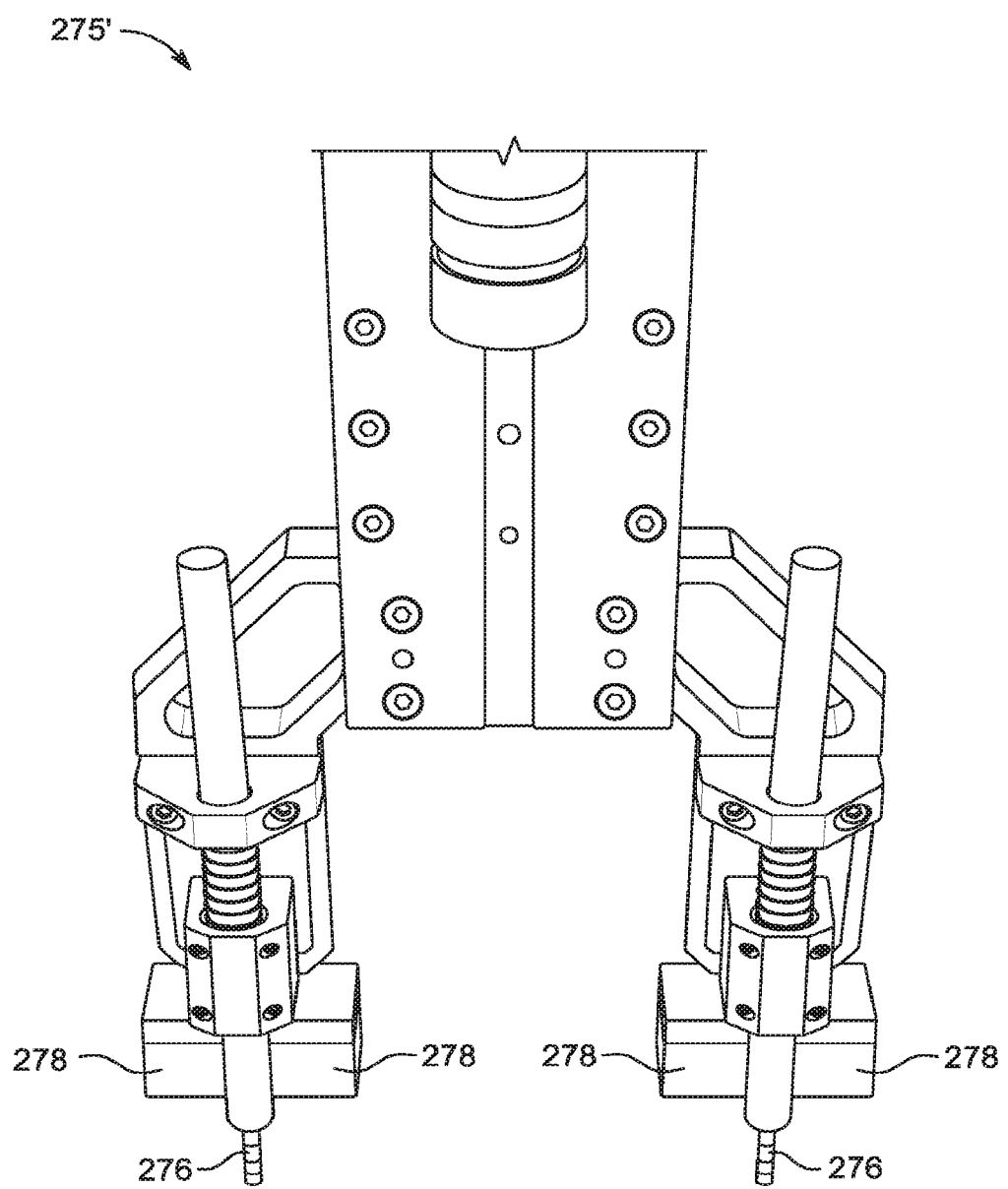
FIG. 4C shows a perspective view of a camera robot, according to one embodiment of the present arrangements and that operates inside the camera testing subsystem shown in FIG. 4A.

FIG. 4C shows a camera robot 275', which is substantially similar to camera robot 275 shown in FIG. 4A, except camera robot 275' clearly shows a pen-shaped end effector 276 disposed adjacent to a covering end effector 278. During camera testing, pen-shaped effector 276 actuates buttons (e.g., home button 261 of test device 265' of FIG. 4D) or contacts predetermined contact regions of a display screen of test device 265', which is substantially similar to test device 265 of FIG. 3B, except test device 265' is in a state of undergoing camera testing. Further, during camera testing, covering end effector 278 covers a proximity and/or light sensor 263 shown in FIG. 4F. During a covering operation, a cylinder (not shown to simplify illustration) allows the entire camera robot (including pen-shaped end effector 276 and covering end effector 278) to displace in the Z-direction relative to proximity and/or light sensor 263 of test device 265.

In an automated implementation of camera testing subsystem 260, testing using pen-shaped end effector 276 and covering end effector 278 is accompanied by having one or more camera test applications on test device 265'. Preferably, these camera test applications, among other types of test applications (e.g., TSP test applications and audio test applications), are stored in a test application controller (e.g., test application controller 1508 shown in FIG. 15). Prior to camera testing using pen-shaped end effector 276 disposed adjacent to a covering end effector 278 as shown in FIG. 4C, one or more of camera test applications are downloaded, installed and launched on test device 265'. Although this may be accomplished in many number of ways, in one preferred implementation, once the wireless connection (e.g., WiFi® connection) profile is launched on test device 245 in TSP testing subsystem 240 of FIG. 3A, then a wireless connection is established between test device 245 and a test application controller (e.g., test application controller 1508 of FIG. 9). Using this wireless connection, one or more camera test applications stored on the test application controller are downloaded, installed and launched on test device 265'.

Regardless of the manner in which camera test applications are downloaded, installed and launched on test device 265', testing by pen-shaped end effector 276 and covering end effector 278 of FIG. 4C is accompanied when these camera test applications are active on test device 265'. If an appropriate test application is launched on test device 265' to enable a wireless connection between test device 265' and test application controller (e.g., test application connector 1502 shown in FIG. 15), then results of camera testing, using pen-shaped end effector 276 and covering end effector 278, obtained from test device 245' may be conveyed back, via the established wireless connection, to the test application controller.

Figure 4D:
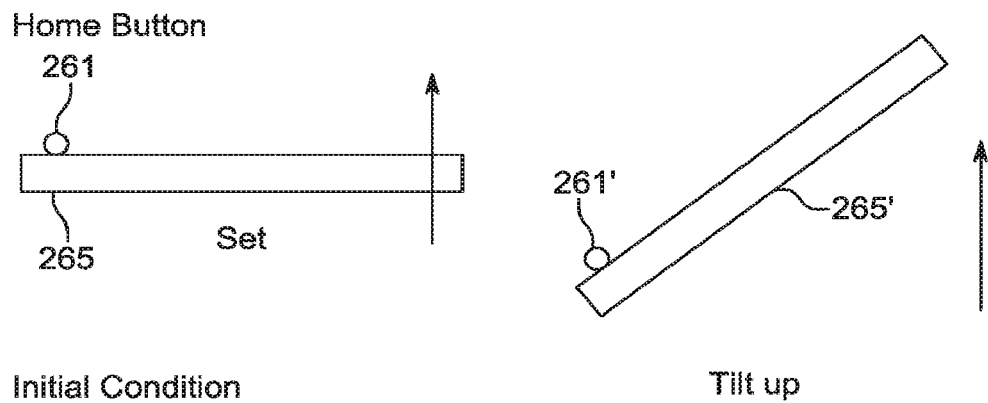
FIG. 4D shows a side view of a test device, according to one embodiment of the present arrangements and that is, in a normal state and then in a tilt-up state, inside the camera testing subsystem shown in FIG. 4A.
Figure 4E:
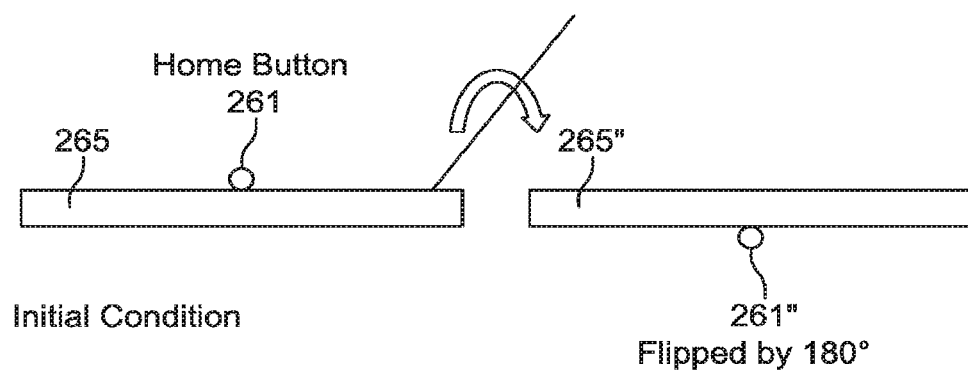
FIG. 4E shows a side view of a test device, according to one embodiment of the present arrangements and that is, in a normal state and then in a 180° rotated state (flipped from a front to a back side facing up), inside the camera testing subsystem shown in FIG. 4A.
Figure 4F:
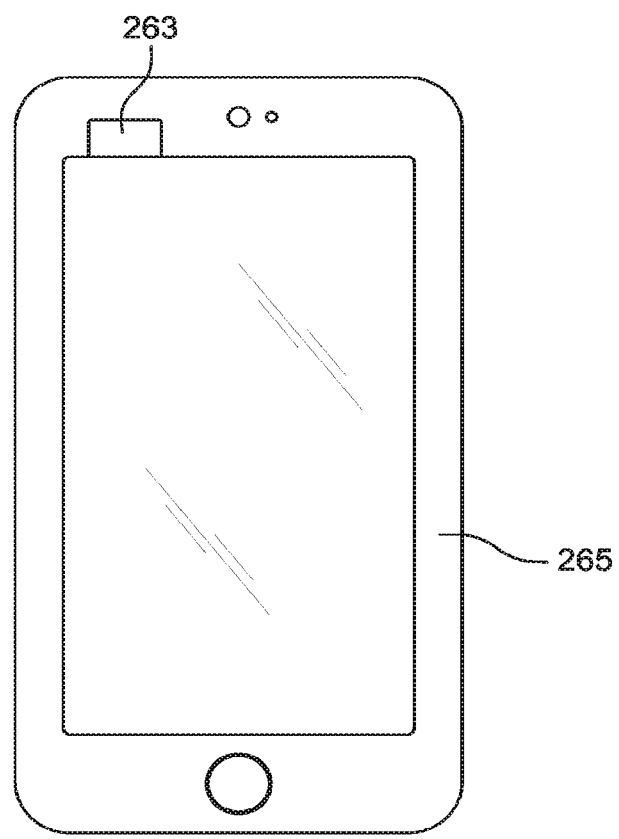
FIG. 4F shows a front view of a test device, according to one embodiment of the present arrangements and that has integrated into it a proximity and light sensor.

During camera testing, test device 265', as shown in FIGS. 4D and 4E is capable of movement in at least two different ways. In an operative state of positioner 274, one end of camera testing jig 266 tilts up in the Z-direction and the other end of camera testing jig 266 correspondingly tilts down. To this end, FIG. 4D shows an initial state when test device 265, with its home button 261 serving as a point of reference at one end, is in a horizontal position secured on camera testing jig 266 (not shown to simplify illustration). FIG. 4D also shows test device 265' in a tilt up state during a camera test operation. In this state, positioner 274 causes an end opposite to home button 261' to tilt up and the end that includes home button 261' tilts down. In other words, the positioner 274 allows test device to rotate about an axis that extends widthwise and through a middle region of test device 265. Such rotation of the test device effectively tests the accelerator sensor of the test device.

In an operative state of turn cylinder 574, one or more device holders 512 flip by 180° or 360°. FIG. 4E shows the two different states 265 and 265' that the test device acquires. According to this figure, in an initial state and similar to the initial state shown in FIG. 4D, test device 265 is in a horizontal position secured on camera testing jig 266 (not shown to simplify illustration). In a flipped-by-180° state, test device 265' is flipped by 180° such that home button 261" faces downwards, as opposed to upwards when it was in its initial state. In other words, turn cylinder 574 allows device holder 512 (or test device 265 secured thereon) to flip along a longitudinal axis that extends lengthwise of device holder 512, or test device 265. Turn cylinder 574 places test device 265 in the flipped-by-180° state during testing of front and/or rear camera and front and/or rear video functionalities.

Figure 5A:
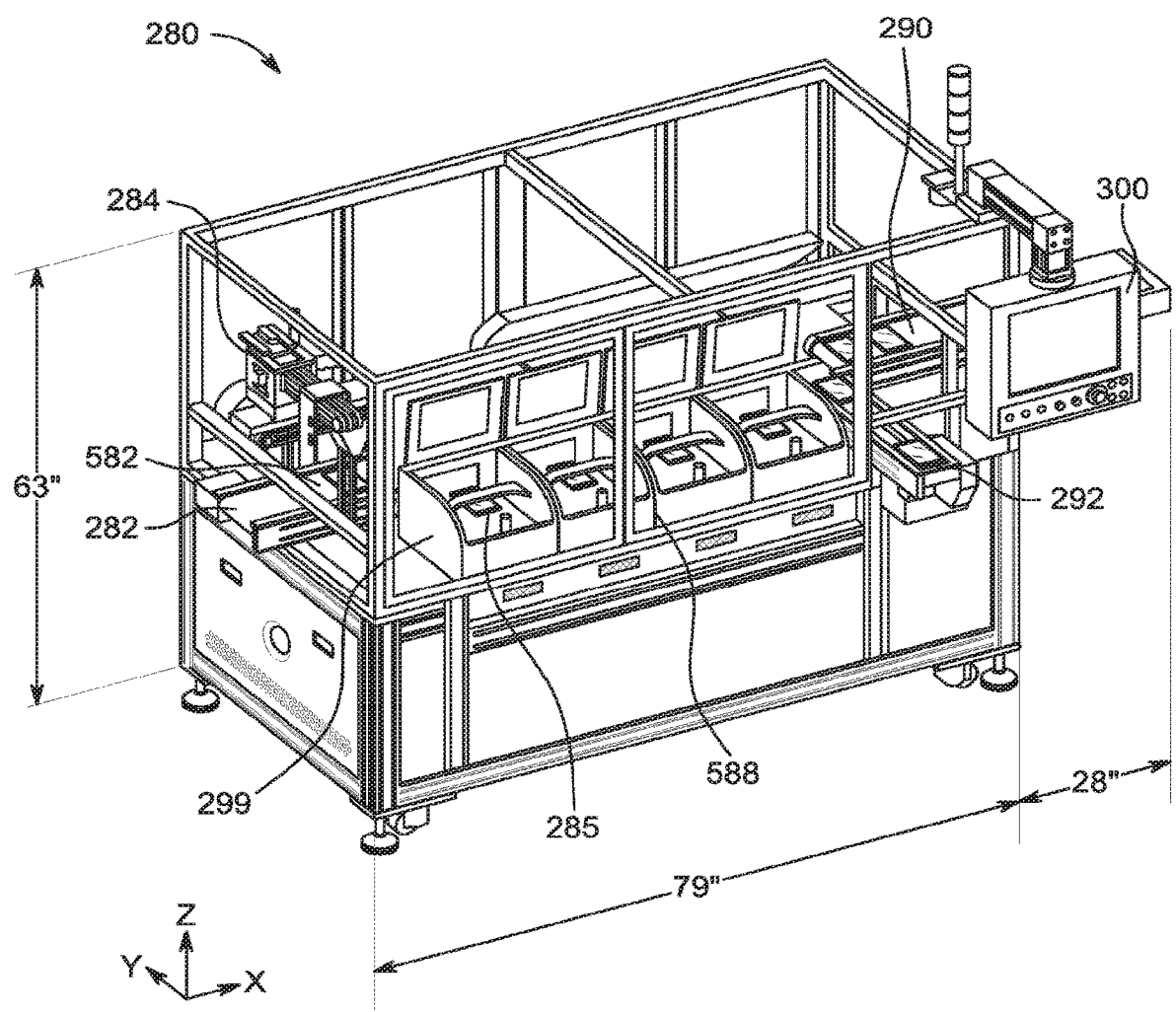
FIG. 5A shows a top perspective view of an audio testing subsystem, according to one embodiment of the present arrangements and that is incorporated into the automated functional testing system of FIG. 1A.

FIG. 5A shows an audio testing subsystem 280, which is substantially similar to audio testing subsystem 180 shown in FIG. 1A and that tests audio functionalities of a test device 285. As shown in FIG. 5A, audio testing subsystem 280 includes, among other components, an audio load conveyor 282, an audio box 299, an audio load/unload robot 284, an audio unload conveyor 290, and an audio reject conveyor 292. Of these components, audio load conveyor 282, audio load/unload robot 284, audio unload conveyor 290, and audio reject conveyor 292 are substantially similar to their counterparts, i.e., TSP load conveyor 242, TSP load/unload robot 244, TSP unload conveyor 250, TSP reject conveyor 252, shown in FIG. 3A. An audio robot 302, which is deployed for testing of audio functionalities inside audio box 299, is described in connection with FIG. 5C in detail below.

Inside audio testing subsystem 280 shown in FIG. 5A, multiple audio boxes are disposed between audio load conveyor 282 and audio unload conveyor 290, allowing for relatively higher throughput values of processed test devices for the present systems and methods than those realized by conventional testing methods. In this case, processed test devices are those that have successfully passed testing of audio functionalities.

Figure 5B:
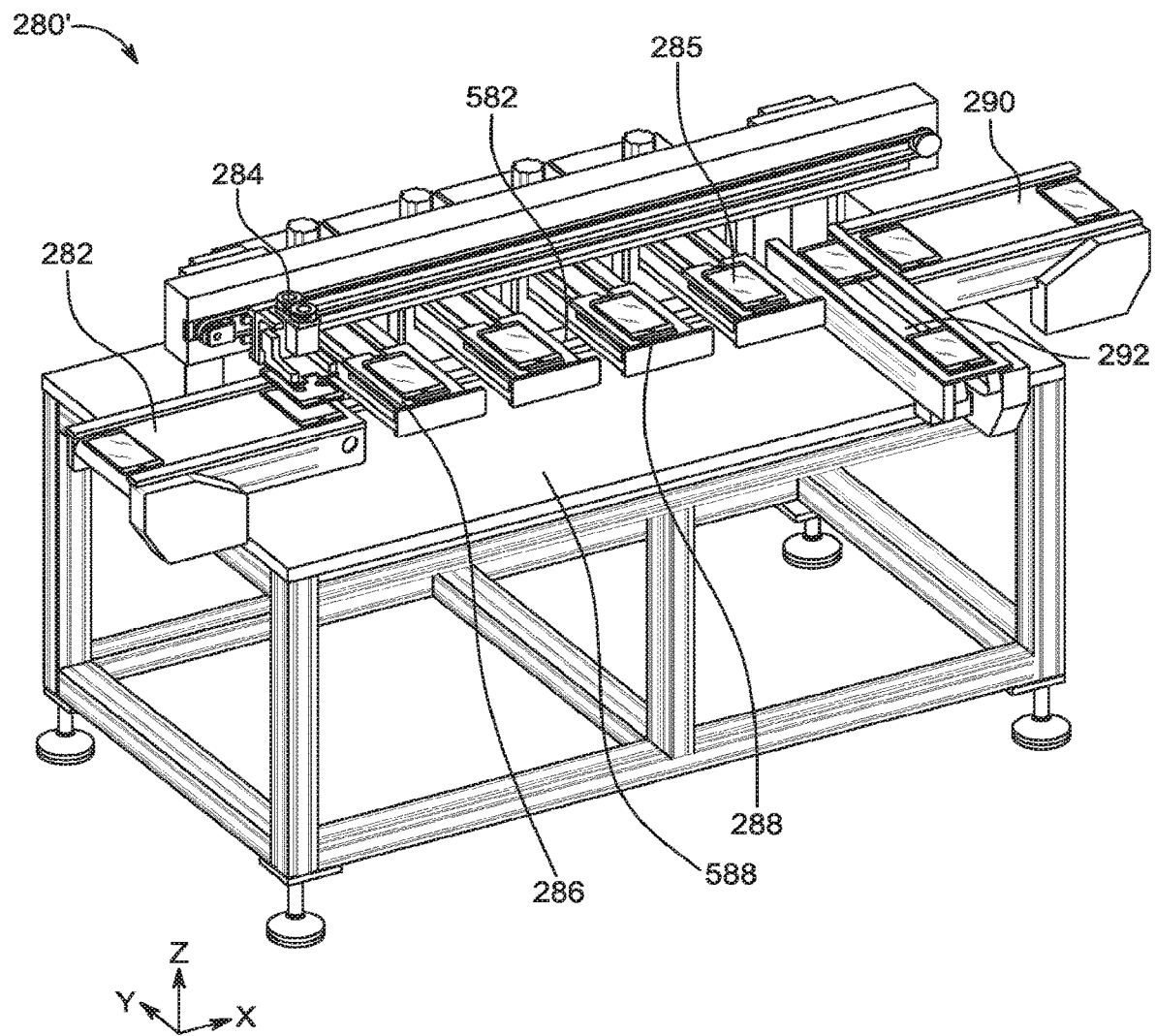
FIG. 5B shows a top perspective view of the audio testing subsystem shown in FIG. 5A and that does not include a cover to expose certain salient components involved in conveyance of test devices.

FIG. 5B shows an audio testing subsystem 280', which is substantially similar to audio testing subsystem 280 of FIG. 5A, except that audio testing subsystem 280', without covers is exposed and shows, in greater detail, salient components responsible for conveying test device 285 in, out of and inside audio testing subsystem 280'. The components responsible for conveyance, inside audio testing subsystem 280 or 280', of test device 285 include a audio test shuttle 288, audio load/unload robot 284, audio unload conveyor 290, and audio reject conveyor 292.

Although not necessary, audio testing subsystem 280 may have defined therein an audio loading/unloading region 582 and an audio testing region 588. Arrangement of such regions contributes to realization of higher throughput values of test devices that undergo audio testing. In the present arrangements, audio load/unload robot 284, preferably, displaces in the X-direction and rapidly loads, one test device 285 at a time, from audio load conveyor 282 to audio loading/unloading region 582. Before audio testing commences, however, audio shuttle 288 displaces audio testing jig 286 in the Y-direction. With test device 285 secured thereon, audio testing jig 286 may specifically displace from audio loading/unloading region 582 to audio testing region 588, where audio testing on test device 285 is carried out. After audio testing is complete, audio shuttle 288, preferably, facilitates return of audio testing jig 286 from audio testing region 588 to audio loading/unloading region 582. From there and depending on its audio test results, test device 285 is disposed. By way of example, if test device 285 passes the audio test, then audio load/unload robot 284 advances test device 285 from audio loading/unloading region 582 to audio unload conveyor 290 for further testing.

In certain embodiments of the present arrangements, audio reject conveyor 292 is provided to remove, from audio testing subsystem 280, test devices that fail audio testing. In preferred embodiments of these arrangements, audio reject conveyor 292 extends substantially perpendicular to audio unload conveyor 290. If test device 285 fails the audio test, then audio load/unload robot 284 conveys test device 285 from audio loading/unloading region 582 to audio reject conveyor 292, which carries it to a reject box that may be an external attachment of audio testing subsystem 280. Test devices in reject box may undergo repair to fix one or more of the defects identified during audio testing.

FIGS. 5A and 5B show that audio testing subsystem 280 and 280' is arranged to have a relatively compact footprint that provides high throughput values for the test devices. In this case, the throughput is of test devices that have passed the audio test. An exemplar width of audio testing subsystem 280 is a value that ranges from about 75 inches to about 85 inches, and is preferably about 79 inches, as shown in FIG. 5A. Width of audio testing subsystem 280 may be extended on each side by a presence of a conveyor. To this end, FIG. 5A shows that audio unload conveyor 290 may be about 28 inches wide. FIG. 5A also shows a height of audio testing subsystem 280 and this value ranges from about 60 inches to about 70 inches, and is preferably about 63 inches. Although FIG. 5A does not indicate a particular value for a depth of audio testing subsystem 280, the present teachings recognize that it may be a value that ranges from about 40 inches to about 50 inches, and may, preferably, be about 43 inches.

FIG. 4C shows important features of an audio robot in its engaged state and in its disengaged state. Regardless of the state, audio robot 302 includes two up/down cylinders 296 and 298. In a disengaged state of audio robot 302, each of two up/down cylinders 296 and 298 are distant from a receiver 505 and a speaker 507 of test device 285, and not able to test the performance of the receiver and the speaker. During audio testing, however, each of two up/down cylinders 296' and 298' acquire an engaged state, in which they are proximate to receiver 505 and speaker 507 of test device 285 and are able to measure the performance of the receiver and speaker. According to the present teachings, audio robot 302 with such features allows for testing microphone functionalities of test device 285.

Figure 5C:
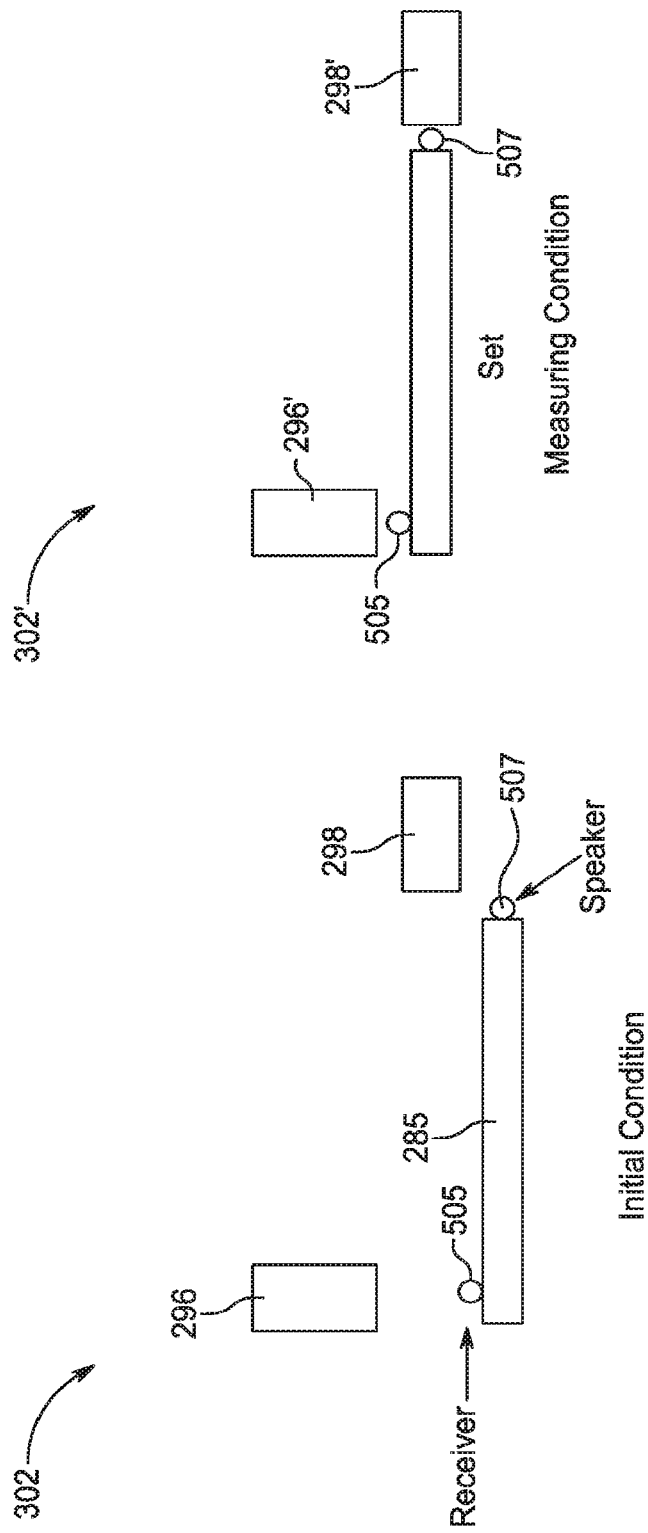
FIG. 5C shows a top view of a test device and audio robot, according to one embodiment of the present arrangements and that includes two up/down cylinders which are in an unengaged and in an engaged position with the test device.

In an automated implementation of audio testing subsystem 280, testing using audio robot 302 is accompanied by having one or more audio test applications on test device 285' as shown in FIG. 5C. Preferably, these audio test applications, among other types of test applications (e.g., TSP test applications and camera test applications), are stored in a test application controller (e.g., test application controller 1508 shown in FIG. 15). Prior to audio testing using audio robot 302', one or more of audio test applications are downloaded, installed and launched on test device 285'. Although this may be accomplished in many number of ways, in one preferred implementation, once the wireless connection (e.g., WiFi® connection) profile is launched on test device 285' in TSP testing subsystem 240 of FIG. 3A, then a wireless connection is established between test device 285' and a test application controller (e.g., test application controller 1508 of FIG. 9). Using this wireless connection, one or more audio test applications stored on the test application controller are downloaded, installed and launched on test device 285'.

Regardless of the manner in which camera test applications are downloaded, installed and launched on test device 285', testing by audio robot 302' of FIG. 5C is accompanied when these audio test applications are active on test device 285'. If an appropriate test application is launched on test device 285' to enable a wireless connection between test device 265' and test application controller (e.g., test application connector 1502 shown in FIG. 15), then results of audio testing, using audio robot 302', obtained for test device 285' may be conveyed to an audio signals measurement system 300. The present teachings recognize that bi-directional communication between audio signals measurement system 300 and audio robot 302' of FIG. 5C may be accomplished by using RS-232C (Serial) standard of communication and transmission. Audio signals measurement system 300, based on the results of audio testing, instructs the audio load/unload robot to either place test device 285 in audio unload conveyor 290 or audio reject conveyor 292.

Although it is not necessary that the camera testing subsystem is disposed prior to the audio testing subsystem as shown in, for example, FIGS. 1A and 1B, but for certain functions placing the camera testing subsystem prior to the audio testing subsystem as shown in these figures represents a preferred embodiment of the present arrangements. By way of example, when testing front and/or read video cameras of the test device, which is explained below, it is preferable to first test the video portion in the camera testing subsystem and then subsequently test the audio portion in the audio test subsystem because, among other reasons, such a specific order of testing yields a high throughput of tested test devices.

As described above, during TSP testing, TSP robot 255' shown in FIG. 3C may displace in X-, Y-, and Z-directions to form pattern 247 shown in FIG. 3D. Further, during camera testing, camera robot 275' shown in FIG. 4C may displace in X- and Z-directions, camera testing shuttle 268 shown in FIGS. 4A and 4B displaces in the Y-direction. Further still, during audio testing, audio robot 302' shown in FIG. 5C may displace in the Z-direction, and audio testing shuttle 288 shown in FIG. 5B displaces in the Y-direction. As described herein, load conveyors, unload conveyors and load/unload robots, deployed in the different testing subsystems, displace in the X-direction. Although displacement in the different linear directions, X-, Y-, and Z-, are shown in FIGS. 1A, 1B, 2A, 2B, 3A, 3B, 4A, 4B, 5A and 5B, displacement in the X-direction conveys displacement that is "side-to-side," displacement in the Y-direction conveys displacement that is "front and/or back" and displacement in the Z-direction conveys displacement that is "up and/or down."

Such displacement of the robots, testing shuttles, load conveyors, unload conveyors, and load/unload robots is, preferably, accomplished using an AC motor and belt or ball and screw arrangement. Displacement in the X-direction by a loading/unloading robot, for example, may include an AC servo-motor and timing belt arrangement that allows displacement of the test device "side-to-side." Displacement in the Z-direction by a camera or audio testing robot may include an AC servo-motor ball and screw arrangement that allows displacement of the test device "up and/or down." In accordance with one embodiment of the present teachings, displacement in the X-direction of the AC servo-motor is macroscopic, but displacement in the Z-direction of the other AC servo-motor (with ball and screw) is microscopic for precise positioning. An exemplar value of a stroke of the AC servo-motor displacing in the X-direction may be about 1,500 mm and an exemplar value of a stroke of the AC servo-motor displacing in the Z-direction may be about 40 mm. Testing shuttles, deployed in the different testing subsystems, may include a load less cylinder that have an exemplar stroke value of 200 mm.

By way of example, TSP robot 255', as shown in FIG. 3C, may include an AC servo-motor, ball and screw in each of X-, Y- and Z-directions to facilitate displacement of the TSP robot to form pattern 247 shown in FIG. 3D. In the X-direction, the servo-motor has an exemplar stroke value of 500 nm and, preferably, there are two motors facilitating displacement of the test device in this direction. In the Y-direction, the servo-motor has an exemplar stroke value of 180 nm and, preferably, there are two motors facilitating displacement of the test device in this direction. In the Z-direction, the servo-motor has an exemplar stroke value of 40 mm, and preferably, there are two motors facilitating displacement of the test device in this direction. Each of the different reject conveyors and unload conveyors, deployed in the different testing subsystems, includes an AC motor belt.

As another example, loading/unloading robot, deployed in the different testing subsystems, include an AC servo-motor and timing belt to allow displacement of the test device in the X-direction and include an AC servo-motor, ball and screw to allow displacement of the test device in the Z-direction. The AC servo-motor that allows for displacement in the X-direction has an exemplar stroke value of about 1,200 mm and the AC servo-motor that allows for displacement in the Z-direction has an exemplar stroke value of about 40 mm. Audio box 299 may include a load less cylinder operation that has an exemplar stroke value of about 300 mm. Regardless of whether a timing belt or a ball and screw are used, the AC servo-motor operates under the action of a control scheme to provide the requisite displacement.

Figure 6:
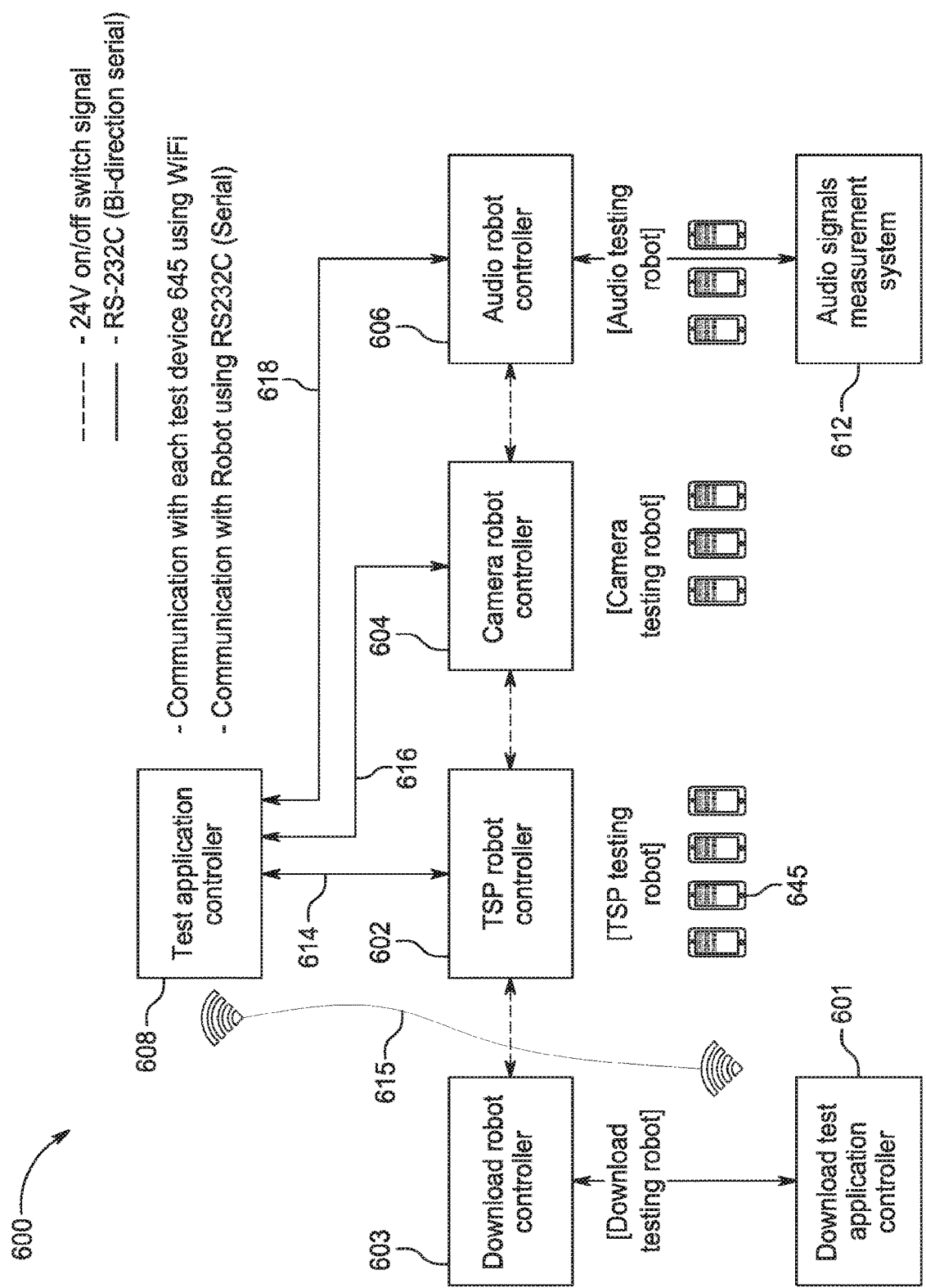
FIG. 6 shows a control scheme, according to one embodiment of the present arrangement, for downloading, installing and launching different types of test applications (e.g., download test applications, TSP test applications, camera test applications, and audio test applications) on the test device when it undergoes testing inside different types of subsystems.
Figure 9:
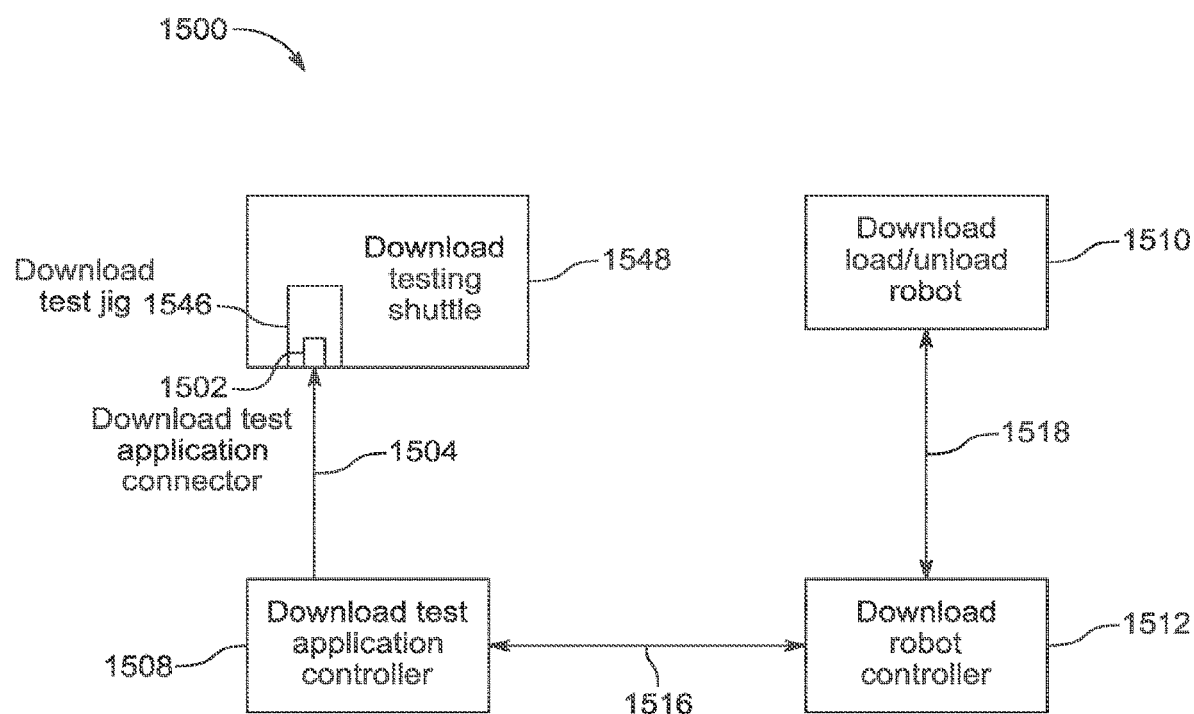
FIG. 9 shows a block diagram of salient components of the automated functional testing systems shown in FIGS. 1A and 7A and that are involved in downloading, installing and launching of different types of test applications on a test device.

FIG. 6 shows a block diagram of a distributed control scheme 600, according to one embodiment of the present arrangements and this responsible for a coordinated displacement of system robots (e.g., test application connector 1502 or a USB® connector shown in FIG. 9, TSP robot 255 shown in FIG. 3A, camera robot 275 shown in FIG. 4A and audio robot 302 shown in FIG. 5C), load/unload robots (e.g., download load/unload robot 224 shown in FIG. 2A, TSP load/unload robot 244 shown in FIG. 3A, camera load/unload robot 264 shown in FIG. 4A, and audio load/unload robot 284 shown in FIG. 5A), and system shuttles (e.g., download testing shuttle 228 shown in FIG. 2A, TSP testing shuttle 248 shown in FIG. 3A, camera testing shuttle 268 shown in FIG. 4A and audio robot testing shuttle 288 shown in FIG. 5B) for the automated functional testing system 100 shown in FIG. 1A.

Distributed control scheme 600 uses two different controllers, a download test application controller 601 and a test application controller 608 to control operations of the different robots and jigs shown in FIG. 1A. Download test application controller 601 controls operation of a download robot controller 603, which in turn controls displacement and operations of a download load/unload robot (e.g., download load/unload robot 224 shown in FIG. 2A), a download testing shuttle (e.g., download testing shuttle 228 shown in FIG. 2A), and a download robot (e.g., download robot 1502 of FIG. 9 that includes a download test application connector). Preferably, a standard RS-232C bi-directional and serial connection between download test application controller 601 and download robot controller 603, allows effective exchange regarding status and control instructions.

Test application controller 608 controls operation of each of a TSP robot controller 602, a camera robot controller 604, and an audio robot controller 606. Preferably, a standard RS-232C bi-directional and serial connection between test application controller 608 and each of robot controllers 602, 604, and 606, allows effective exchange regarding status and control instructions. Preferably, a 24-volt on/off switch signal allows communication between download robot controller 603 and TSP robot controller 602. TSP robot controller 602 and camera robot controller 604, and camera robot controller 604 and audio robot controller 606. Accomplishing coordinated operation within automated functional testing system 100 shown in FIG. 1A, communicating using the standard RS-232C bi-directional and serial connection and the 24-volt on/off switch signal, represents a preferred embodiment of the present teachings.

TSP robot controller 602 controls displacement and operations of a TSP load/unload robot (e.g., TSP load/unload robot 244 shown in FIG. 3A), a TSP testing shuttle (e.g., TSP testing shuttle 248 shown in FIG. 3A), and a TSP robot (e.g., TSP robot 255 of FIG. 2A).

Camera robot controller 604 controls displacement and operations of a camera load/unload robot (e.g., camera load/unload robot 264 shown in FIG. 4A), a camera testing shuttle (e.g., camera testing shuttle 268 shown in FIG. 4A), and a camera robot (e.g., camera robot 275 of FIG. 4A).

Audio robot controller 606 controls displacement and operations of an audio load/unload robot (e.g., camera load/unload robot 284 shown in FIG. 5A), an audio testing shuttle (e.g., audio testing shuttle 288 shown in FIG. 5B), and an audio robot (e.g., audio robot 302 of FIG. 5C).

As will be explained later in connection with FIG. 9, a wireless connection (e.g., wireless connection 615 of FIG. 6), preferably established between test application controller 608 and test device in each of TSP testing subsystem 140, camera testing subsystem 160, and audio testing subsystem 180 of FIG. 1A, allows test devices, undergoing testing, to communicate with test application controller 608 of FIG. 6.

Figure 7A:
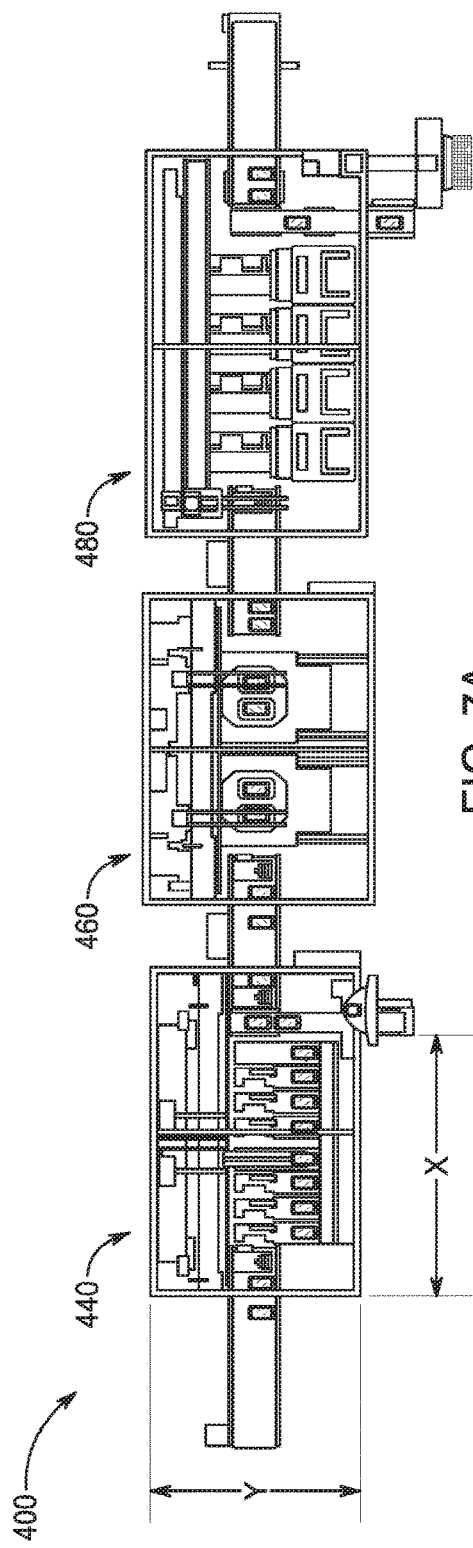
FIG. 7A shows a top view of another automated functional testing system, according to an alternate embodiment of the present arrangements and that is used for automatically testing various functionalities of test devices.

FIG. 7A shows a top view of an automated functional testing system 400, according to one embodiment of the present arrangements. Moreover, test application controller 608 of FIG. 6 controls the operation and movement of the different robots and shuttles present in each of the component subsystems. Automated functional testing system 400 includes a TSP testing subsystem 440, camera testing subsystem 460 and audio testing subsystem 480 that are substantially similar to their counterparts, i.e., TSP testing subsystem 140, camera testing subsystem 160 and audio testing subsystem 180, shown in FIG. 1A.

Figure 7B:
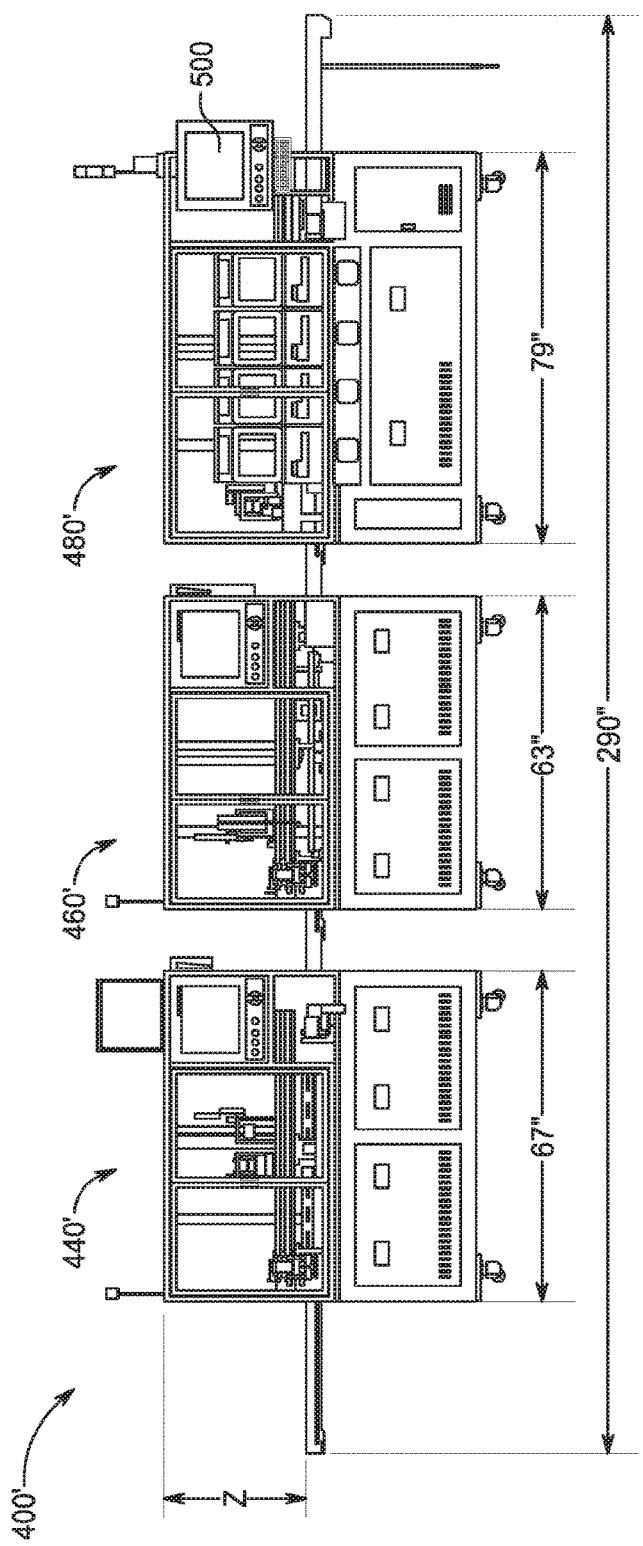
FIG. 7B shows a side view of the automated functional testing system shown in FIG. 7A.

FIG. 7B shows an automated functional testing system 400', which is a side view of automated functional testing system 400 shown in FIG. 7A. Automated functional testing system 400' includes TSP testing subsystem 440', camera testing subsystem 460' and audio testing subsystem 480' that are substantially similar to their counterparts, i.e., TSP testing subsystem 140', camera testing subsystem 160' and audio testing subsystem 180', shown in FIG. 1B. In one preferred embodiment of the present arrangements, a width of each of TSP testing subsystem 140' is about 67 inches, camera testing subsystem 160' is about 63 inches and audio testing subsystem is about 79 inches. Further, such a compact footprint of the present automated functional testing system allows a throughput value that ranges from about 100 test devices to about 120 test devices that undergo testing per hour through automated functional testing system 400' and each of its subsystems.

Figure 8:
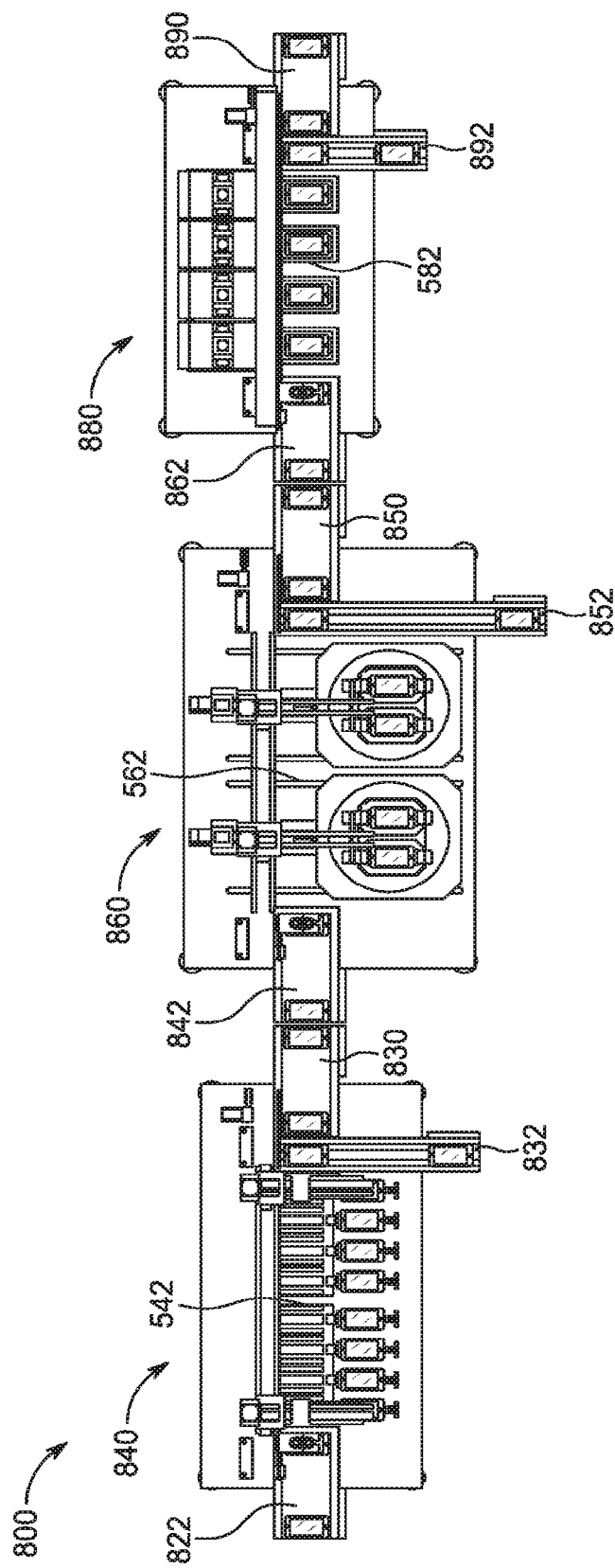
FIG. 8 shows a top view of the automated functional testing system shown in FIG. 7A and that shows the salient components involved in conveyance of a test device from one subsystem to another when it passes testing, and removal of the test device when it fails testing.

FIG. 8 shows an automated functional testing system 800, according to one embodiment of the present arrangements. Automated functional testing system 800 is substantially similar to automated functional testing system 400 of FIG. 7A, except that system 800 is shown to highlight the salient components involved in effective and rapid conveyance of a test device from one location to another during testing. More importantly regardless of orientation of the component subsystems, the load conveyors, the load/unload regions and the unload conveyors in each of the subsystems, e.g., a TSP testing subsystem 840, a camera testing subsystem 860 and an audio testing subsystem 880, are arranged substantially linearly, in the X-direction. By way of example, TSP load conveyor 822 aligns with or is same as download unload conveyor (e.g., download load conveyor 230 of FIG. 2A), TSP unload conveyor 830 aligns with or is same as camera load conveyor 842, camera unload conveyor 850 aligns with or is same as audio load conveyor 862. The load/unload regions disposed between each of these load conveyors and unload conveyors are also similarly linearly aligned. For example, TSP load/unload region 542 of TSP testing subsystem 840, camera load/unload region 562 of camera testing subsystem 860 and audio load/unload region 582 of audio testing subsystem 880 are also linearly aligned, in the X-direction, with the above-described load and unload conveyors.

In this linear configuration that extends in the X-direction, the load/unload robots in each of the subsystems (e.g., download load/unload robot 224 of FIG. 2A, TSP load/unload robot 244 of FIG. 3A, camera load/unload robot 264 of FIG. 4A, and audio load/unload robot 284 of FIG. 5A) traverse in the X-direction, allowing for a high throughput of test devices processed in automated functional testing system 800 of FIG. 8 or automated functional testing system 100 of FIG. 1A. For effective removal of test device that fail testing, reject conveyors, i.e., TSP reject conveyor 832, camera reject conveyor 852 and audio reject conveyor 892, are arranged perpendicular (i.e., extend in the Y-direction) to the linear arrangement of the load conveyors, load/unload regions and unload conveyors in each of the subsystems. This perpendicular arrangement of the different reject conveyors ensures that there is no disruption in the advancement, of test devices that are undergoing testing, from one subsystem to another.

The present arrangements and teaching not only offer high throughput, but also streamline the test results obtained from testing conducted inside each subsystem. Specifically, the test results are identified by a device identification code that is associated with the test device. In one embodiment of the present teachings, an International Mobile Equipment Identity ("IMEI") number of a device is retrieved from the test device and the different test results are associated with this IMEI number and stored. The IMEI number is a unique identification or serial number, typically 15 digits long that identifies a smart phone or mobile device, and has no relation to its user or subscriber. The IMEI number is used by Global Systems for Mobile Communications ("GSM") network to identify valid devices and may be used for preventing a stolen smart phone or mobile device from accessing the network. For example, if a mobile phone is stolen, the owner may call their network provider and instruct them to blacklist the phone using its IMEI number.

The present teachings recognize, however, that associating test results of a test device with its IMEI number or some other similar type of device identification code has many advantages. For example, a test and repair history of the test device may be developed, maintained and made available to a network, user or subscriber when needed. As another example, a manufacturer of the test devices may correlate the defects identified during testing with specific lots (of test devices) based on the IMEI numbers. This would allow manufactures to conduct certain analysis (e.g., trend analysis) and gain insight into obtaining high yields from the device manufacturing process.

FIG. 9 shows a functional block diagram 1500, according to one embodiment of the present arrangements and that is relevant to download testing subsystem 120 of FIG. 1A. Diagram 1500 shows a download testing shuttle 1548, which displaces a download test jig 1546 during testing. As shown in FIG. 9, download test jig 1546 is fitted with a download test application connector 1502 (e.g., a USB port) that connects with a data/power receiving port of a test device and a download test application controller 1508. As a result, a download test application connection (e.g., USB connection) 1504 forms to connect a test device (not shown to simplify illustration) with download test application controller 1508. Preferably, download test application connection 1504 is a hard connection, and that is not wireless. In one embodiment of the present arrangements, one or more computers serve as download test application controller 1508 and have stored thereon a download test application and/or an operating system (preferably the most recent version of an operating system). Download test application controller 1508 is communicatively coupled, through a bi-directional connection 1516, to a download robot controller 1512. Download robot controller 1512 controls both a download load/unload robot 1510 and download test application connector 1502. Download load/unload robot 1510 of FIG. 9 is substantially similar to download load/unload robot 224 shown in FIG. 2A.

In an operative state of the download robot controller 1512, download load/unload robot 1510 is instructed to load a test device present on a download load conveyor (e.g., download load conveyor 222 of FIG. 2A) to a download test jig (e.g., download test jig 1546 of FIG. 9 or download testing jig 226 of FIG. 2A).

In another operative state of download robot controller 1512, download test application connector 1502 is instructed to engage with data/power receiving port of the test device to form download test application connection 1504. One or more download test applications, stored on download test application controller 1508, are downloaded on the test device using download test application connection 1504. In one embodiment of the present teachings, an operating system, preferably a recent version, is stored on download test application controller 1508 and downloaded on the test device, using download test application connection 1504, prior to downloading of one or more of the download test applications. In connection with FIGS. 11-17, launching of one or more of the download test applications, retrieving an IMEI number, testing different types of functionalities and associating the test results with a device identification code, e.g., IMEI number, are described below.

Figure 10:
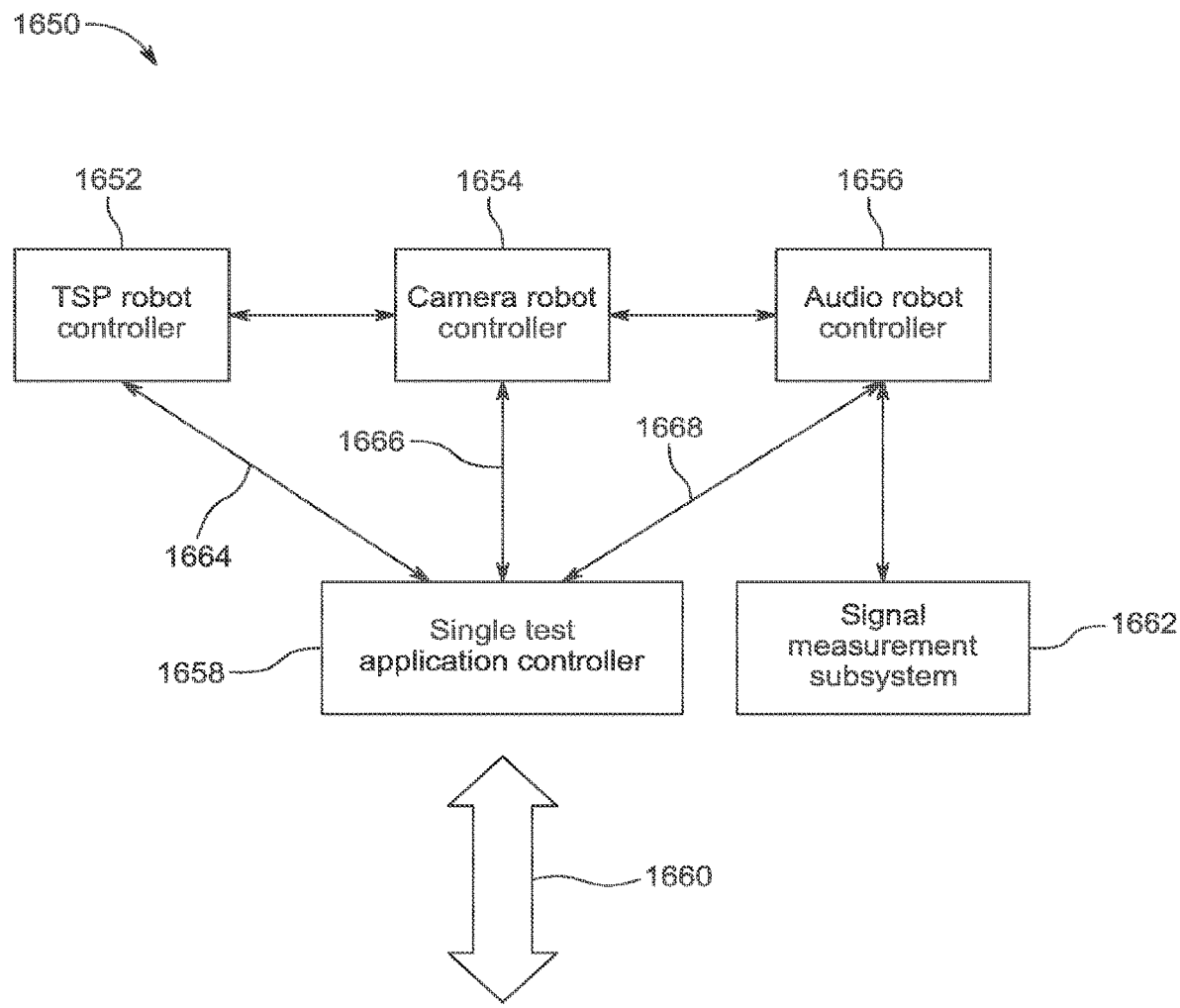
FIG. 10 shows a block diagram of a control scheme for controlling disposition of the different types of subsystem robots (e.g., download testing robot, TSP testing robot, camera testing robot, and audio testing robot).

FIG. 10 shows a control scheme 1650, according to one embodiment of the present arrangements, implemented in TSP testing subsystem 440, camera testing subsystem 460 and audio testing subsystem 480 as these testing subassemblies are shown in FIG. 7A. The robots and related components that perform a mechanical action during testing (e.g., TSP, camera and audio test shuttles that displace during testing), in each of these test assemblies, i.e., TSP robot, camera robot and audio robot, are controlled by their respective controllers, i.e., TSP robot controller 1652, camera robot controller 1654 and audio robot controller 1656. TSP robot controller 1652, camera robot controller 1654 and audio robot controller 1656 are substantially similar to their counterparts, i.e., TSP robot controller 602, camera robot controller 604 and audio robot controller 606 shown in FIG. 6.

Each of these controllers is communicatively coupled to preferably a single test application controller 1658 through their respective bi-directional connections, i.e., connections 1664, 1666 and 1668. As explained in connection with FIG. 17, single test application controller 1658 is communicatively coupled to a plurality of test devices 1660, preferably, using a wireless connection once a download test application is launched on the test device. Further, an audio signal measurement subsystem 1662 is bi-directionally coupled to audio robot controller 1656. In one preferred embodiment of the present arrangements, audio signal measurement subsystem 1662 is not directly coupled to test application controller 1658, and may operate completely independently of test application controller. As a result, control scheme 1650 allows test robots and related components that perform a mechanical action during testing, in each of the different types of testing subsystems and controlled by their respective robot controllers, i.e., robot controllers 1652, 1654 and 1656, coordinate their movement with the launched download test application, which is controlled by test application controller 1658, on the test device to effectively test the test device.

In accordance with one aspect, the present arrangements offer a unique and novel an audio testing subsystem. In an operative state, this subsystem tests different audio functions performed by test devices. In a preferred embodiment, an audio test assembly of the present arrangements includes an audio robot, which in an operative state actuates keys and/or buttons or probes components that are used in obtaining an audio signal or audio from the test device. The audio testing subsystem, in this preferred arrangement, also includes an audio robot controller, which in an operative state controls disposition of the audio robot and in conjunction with operation of the audio test applications facilitates test of audio functions performed by the test device.

Continuing with the preferred audio testing subsystem, the arrangement includes an audio box (e.g., audio box 299 of FIG. 5A) inside which a test device, undergoing testing, is placed. The audio box preferably comes with appropriate audio insulation to avoid external noise interference from compromising the reliability and accuracy of the audio test being performed inside the audio box. Further, the audio signals emanating as a result of the audio test being performed on the test device are conveyed to a separate controller referred to as an audio signal measurement system 1662. As explained above, system 1662 is bi-directionally coupled to audio robot controller 1656.

Figure 15:
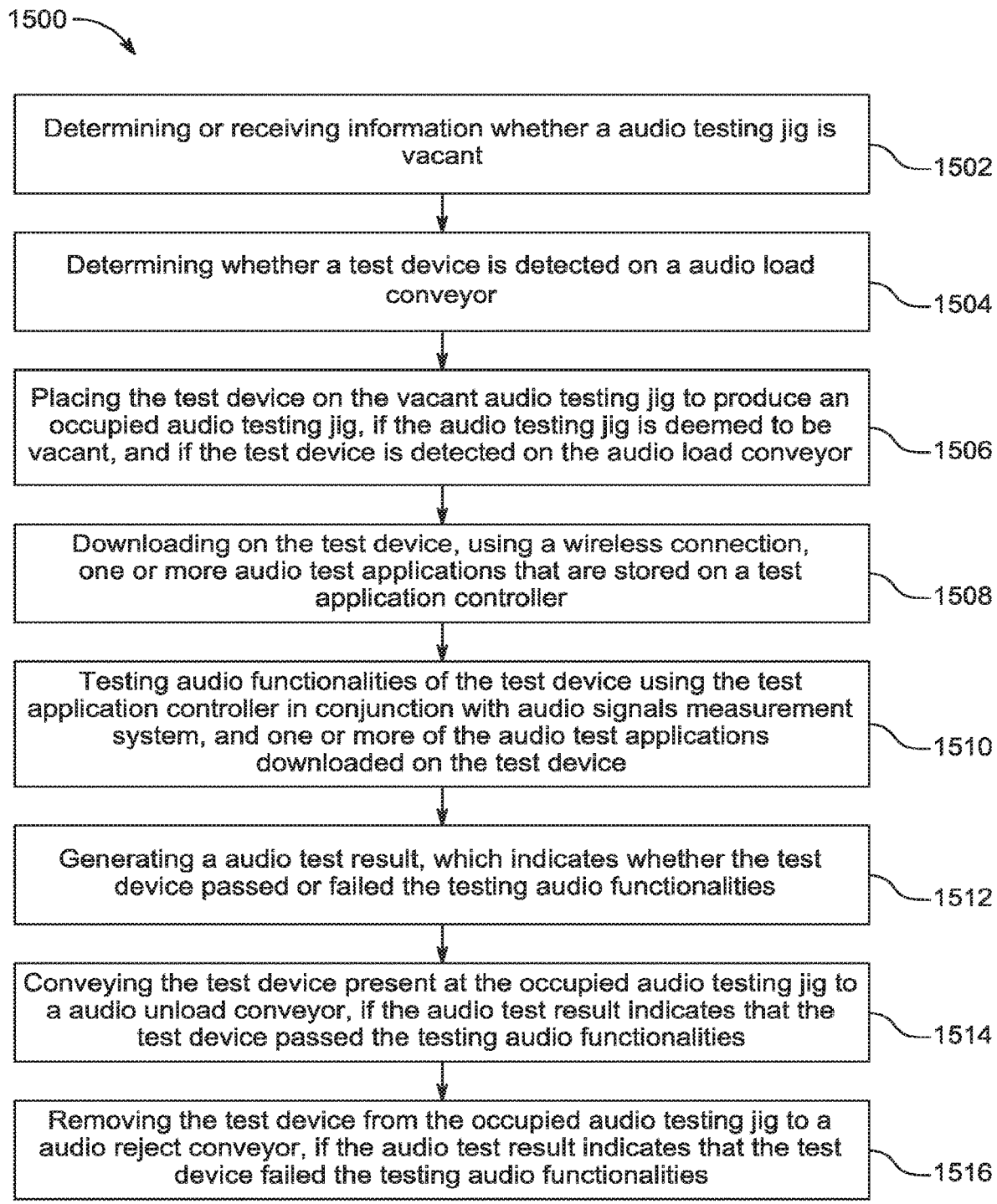
FIG. 15 shows a flowchart of a method of testing, according to one embodiment of the present teachings, audio functionalities of a test device.
Figure 16:
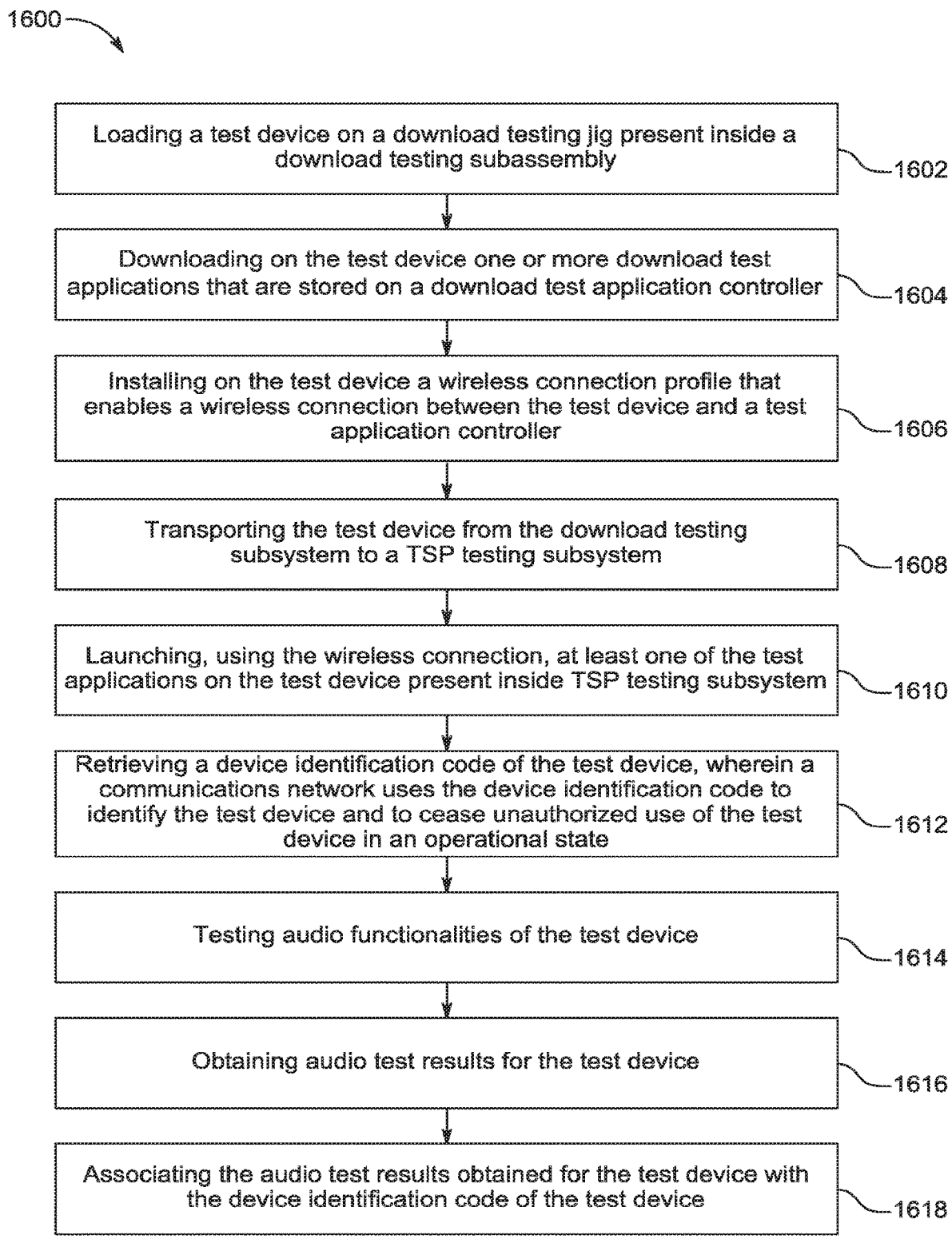
FIG. 16 shows a flowchart of a method of automatically associating, according to one embodiment of the present teachings and during testing of a particular test device, audio functionalities' test results and the device identification code.

In one embodiment, the present arrangements, e.g., as described in FIGS. 6 and 10, offer a distributed control scheme where the various control functions (e.g., of controlling the position or conveyance of the test device using different types of testing shuttles, different types of load/unload robots, different types of testing robots, progression of test application as it is launched on the test device) are distributed using different control components (e.g., test application controller 1658, TSP robot controller 1652, camera robot controller 1654 and audio robot controller 1656) as shown in FIG. 16. Such a distributed control scheme offered by the present arrangements and teachings offer many advantages over a conventionally integrated control scheme, where the different control functions are integrated into a single or fewer control components (hereinafter referred to as the "integrated control scheme") than those shown in FIGS. 15 and 16.

The present teachings recognize that the conventional integrated control schemes are expensive and offer little or no flexibility. Specifically, in attempt to accomplish compatibility between the different control functionalities and different control components in the integrated control scheme approach, the functionalities and the components are sequenced in a particularly rigid manner. Further, the present teachings also recognize that one or few components that provide an integrated control approach are also relatively expensive. A user purchasing and employ the conventional control systems in a manufacturing facility, is bound to the seller of the integrated control scheme. The expense problem is further exacerbated when different models of test devices are introduced into the market and the control schemes and test sequencing needs modification to account for changes in the design and/or functionalities of the test device.

In sharp contrast, the distributed control schemes of the present arrangements do not suffer from such drawbacks Specifically, such distributed control schemes are relatively inexpensive over their integrated counterparts. Moreover, the distributed control schemes offer a significant flexibility to the manufacturer, who can simplify reprogram the relevant ones of the control components to account for changes in the test sequence or implementing new tests. In other words, the rigid structure of sequencing different tests and reestablishing compatibility of all the different integrated functionalities and/or components encountered in the integrated control scheme approach, when introducing new features and/or tests, are avoided in the distributed control scheme approach of the present arrangements. In the distributed control scheme, when a new test model is introduced, for example, the relevant control functionalities and/or components that need modification are modified or if a new control component needs to be added, it is easily added to the existing distributed control scheme. The manufacturer, who implements the distributed control scheme of the present arrangements, is also not at the mercy of a single seller (as in the integrated controls scheme) of the control scheme because he can purchase the different control components from other parties.

More importantly, the distributed control scheme allows different test functionalities to be implemented inside different subsystems at the same time. This represents a marked improvement over the conventional integrated control schemes because the present arrangements yield a significantly higher throughput of the tested test devices over those obtained from conventional schemes. By way of example, in an integrated control scheme approach it is common to conduct a certain type of camera testing and audio testing in the same chamber and the noise made by movement of test robot routinely interferes with an adjacent audio box, inside which a test device is undergoing audio testing. Audio results or audio signals obtained from such interference do not provide meaningful and/or reliable results for the test. Again, in sharp contrast, the distributed control scheme of the present arrangement allows different subsystems to be used such that one is dedicated to camera testing and another to audio testing and any noise emanating from camera robot movement does not interfere with an audio box disposed inside an audio subsystem, which is a different chamber from the chamber that is part of the camera subsystem. Thus, the audio test results produced from audio testing according to the present teachings is meaningful and reliable.

Figure 17:
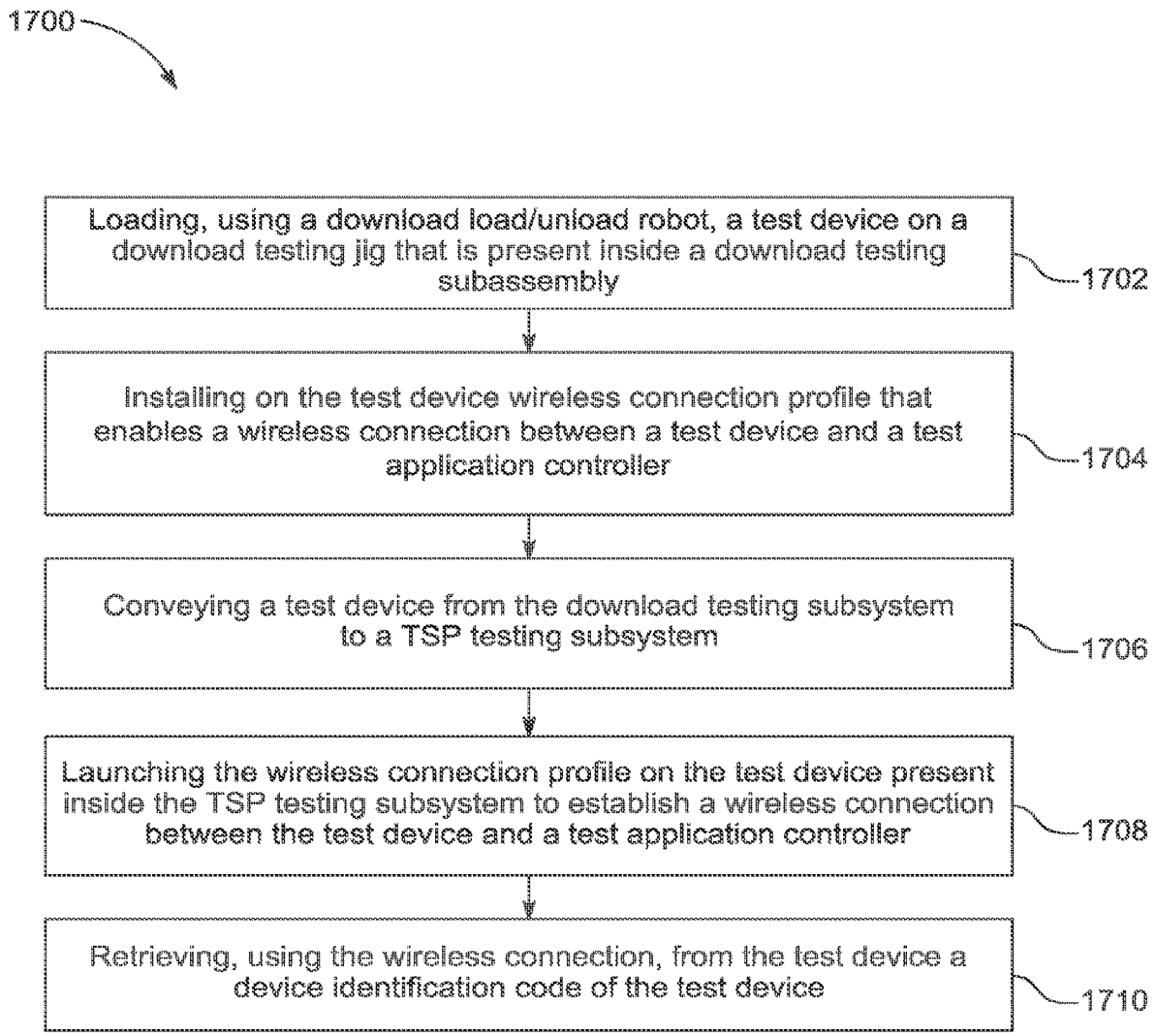
FIG. 17 shows a flowchart of a method of retrieving, according to one embodiment of the present teachings, the device identification code using the block diagram shown in FIG. 9.

FIG. 17 shows a flow chart for a test device tracking process 1700, according to one embodiment of the present teachings. Preferably, process 1700 begins with a step 1702, which involves loading, using a download load/unload robot (e.g., download load/unload robot 224 of FIG. 2A) a test device on a downloading testing jig (e.g., download testing jig 226 of FIG. 2A) present inside download testing subsystem (e.g., download testing subsystem 220 of FIG. 2A).

Next, a step 1704 may include downloading an operating system on the test device. In accordance with one embodiment of the present teachings, preferably a recent version of an operating system that is stored on a download test application controller (e.g., download test application controller 1508 of FIG. 9 or download test application controller 601 of FIG. 6) is downloaded onto the test device using a download test application connector (e.g., download test application connector 1502 of FIG. 9). The download test application connector engages with a data and/or power receiving port on the test device to form a download test application connection (e.g., a USB® connection).

Step 1704 is an optional step and is not necessary according to the present teachings. In certain embodiments of the present teachings, after step 1702, process 1700 proceeds directly to step 1706, if an operating system was installed in test device prior to step 1702.

Then, a step 1706 includes downloading a download test application on the test device. In accordance with one embodiment of the present teachings, one or more download test applications stored on a download test application controller (e.g., download test application controller 1508 of FIG. 9 or download test application controller 601 of FIG. 6) is installed on the test device using the download test application connector (e.g., download test application connector 1502 of FIG. 9).

After step 1706 concludes, another step 1708 is carried out. This step involves installing a wireless connection (e.g., WiFi® connection) profile on the test device. The installation of the wireless connection profile is designed to enable a wireless connection between the test device and a test application controller (e.g., test application controller 1658 of FIG. 166 or test application controller 608 of FIG. 6). Step 1708 may be carried out using the same components (e.g., download test application controller 601 of FIG. 6 or download test application controller 1508 of FIG. 9, and download test application connector 1502 of FIG. 9) described in step 1706.

In an optional implementation, process 1700 then proceeds to a step 1710, in which the test device is conveyed from a download testing subsystem (e.g., downloading subsystem 120 of FIG. 1A) to a TSP testing subsystem (e.g., TSP testing subsystem 140 of FIG. 1A). In this implementation, above-mentioned steps 1702, 1704 (optional) and 1706 are carried out in a downloading testing subsystem (e.g., download testing subsystem 120 of FIG. 1A) and subsequent steps described below, i.e., steps 1708 and 1710 may be carried out in TSP testing subsystem (e.g., TSP testing subsystem 140 of FIG. 1A).

Next, step 1708 includes launching, through the wireless connection, a test application on the test device using the test application controller (e.g., test application controller 1658 of FIG. 10 or test application controller 608 of FIG. 6).

Then, step 1710 is performed and includes retrieving a device identification code (e.g., an IMEI number) of the test device. By way of example, test application controller 1658 of FIG. 16 or test application controller 60S of FIG. 6 is used to perform this retrieving step. As explained in connection with FIGS. 12A, 12B, 14, and 16, each of the subsequent test results obtained for a particular test device are preferably associated with its device identification code, in this manner, an entire test results report may be prepared for a particular device identification code. As mentioned before, the present teachings recognize that, among other advantages, such a tracking method, using the device identification code, allows a manufacturer or a test facility to trace the testing of each test device and maintain a history of that test device. Such information is extremely useful when establishing a product life cycle for a particular test device.

Figure 11:
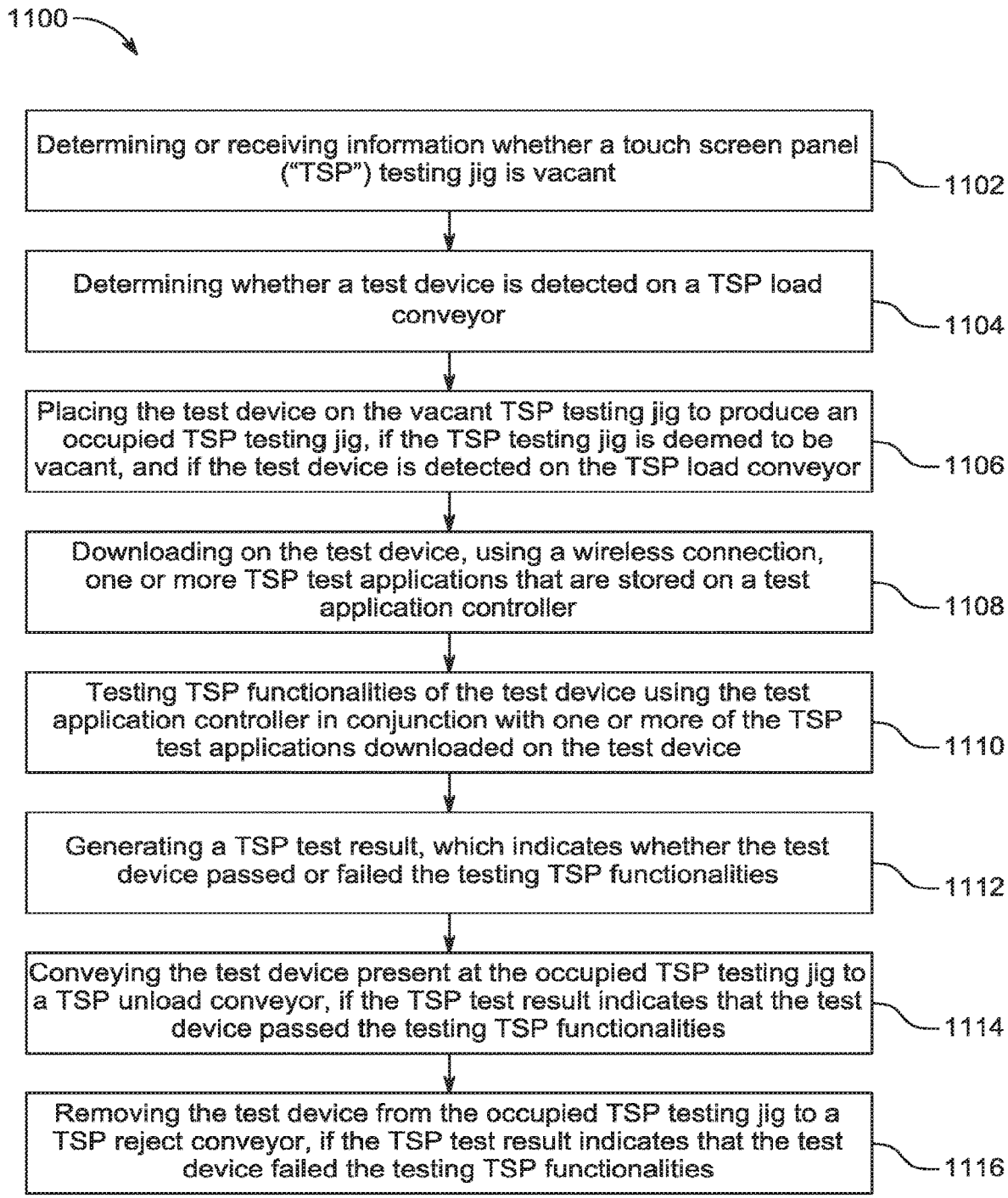
FIG. 11 shows a flowchart of a method of testing, according to one embodiment of the present teachings, TSP functionalities of a test device.
Figure 12A:
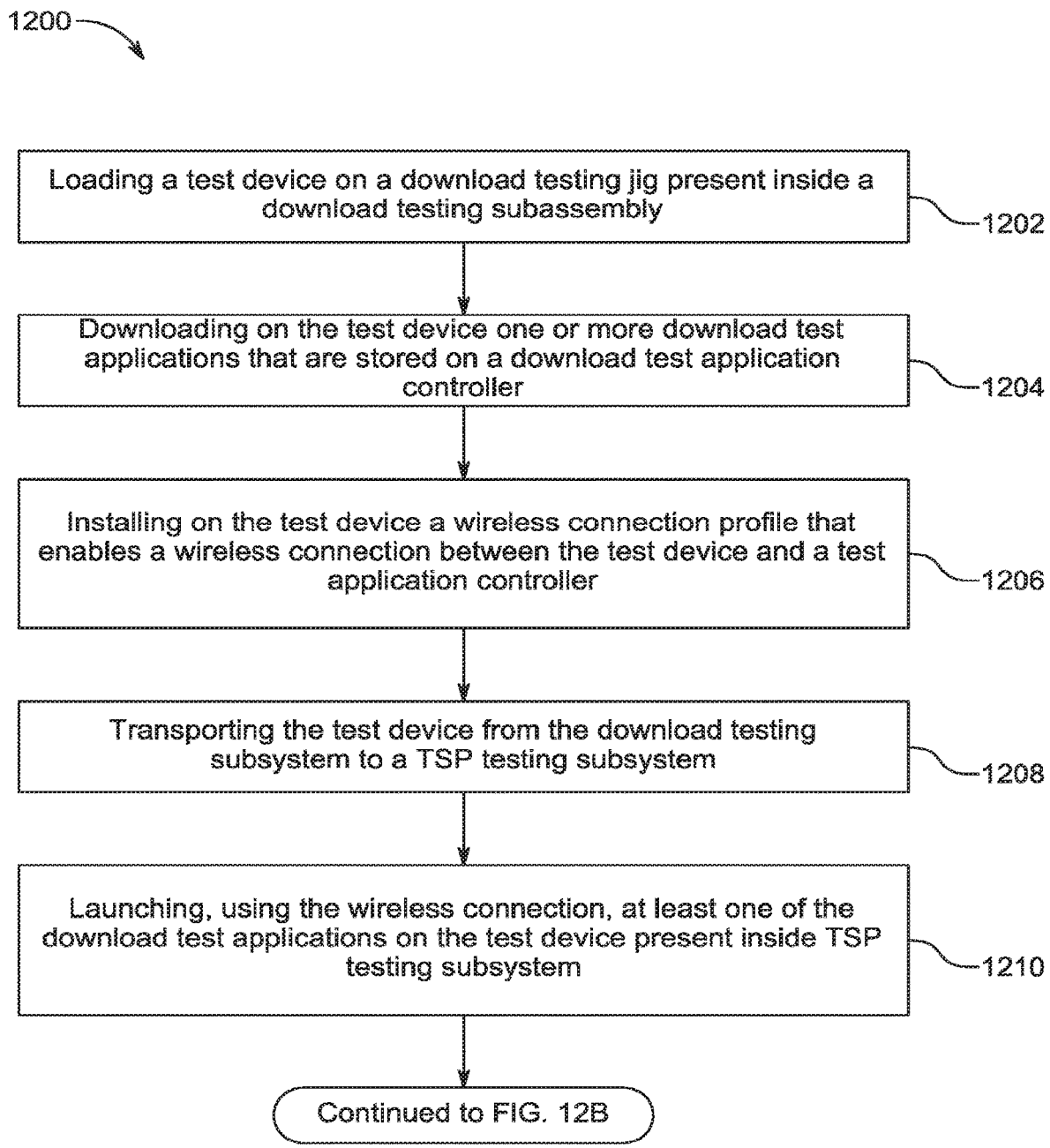
FIGS. 12A and 12B show a flowchart of a method of automatically associating, according to one embodiment of the present teachings and during testing of a particular test device, TSP functionalities' test results and a device identification code (e.g., International Mobile Equipment Identity ("IMEI") number) of that test device.
Figure 12B:
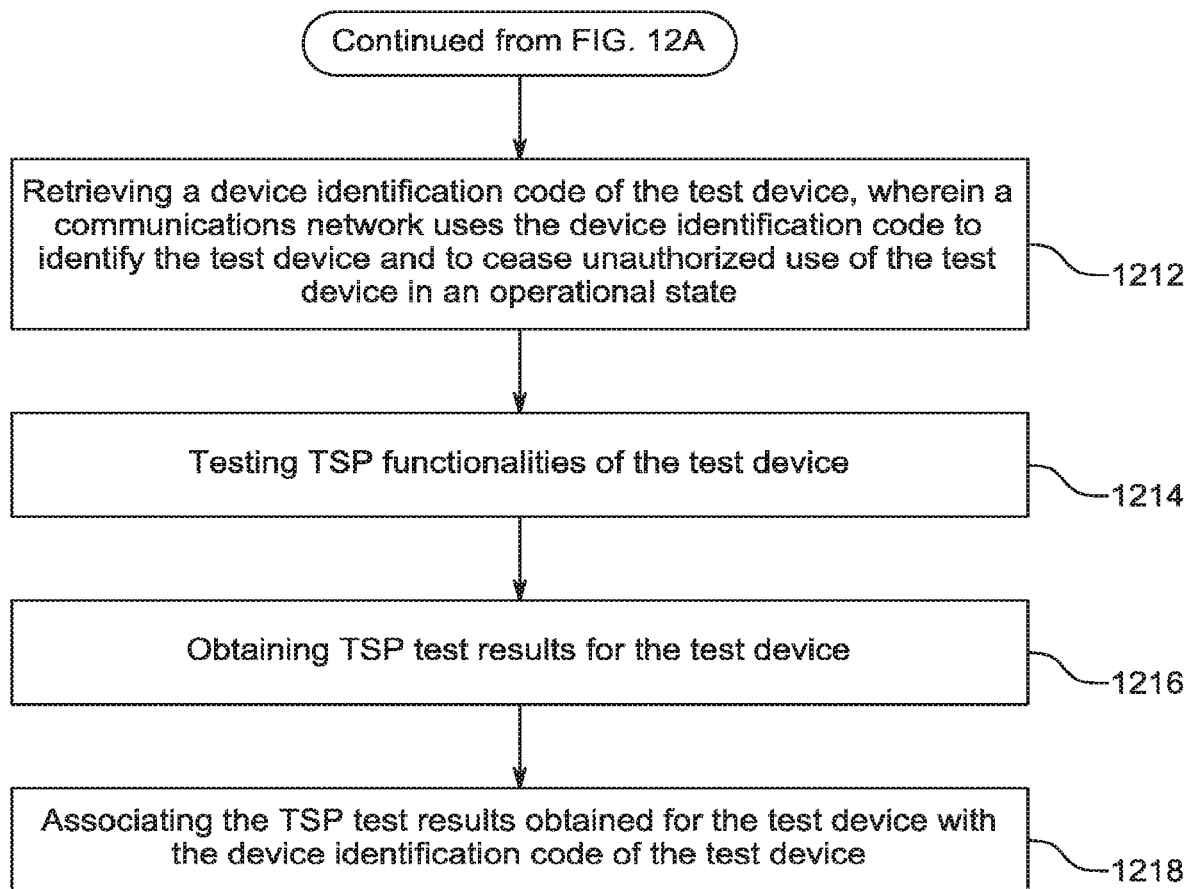

FIG. 11 shows a flow chart of a method of TSP testing 1100, according to one embodiment of the present teachings. Method 1100 may begin with a step 1102, which includes determining or receiving information whether a TSP testing jig (e.g., TSP testing jig 246 of FIG. 3A) is vacant. Next, a step 1104 includes determining whether a test device (e.g., test device 245) is detected on a TSP load conveyor (e.g., TSP load conveyor 242 of FIG. 3A). Step 1104 may be performed using a TSP load conveyor sensor.

If the TSP testing jig is deemed to be vacant, and if the test device is detected on the TSP load conveyor, then method 1100 proceeds to step 1106. This step includes placing the test device on the vacant TSP testing jig to produce an occupied TSP testing jig. Step 1106 is performed using a TSP load/unload robot (e.g., TSP load/unload robot 244 of FIG. 3A).

With the test device present on the TSP testing jig, step 1108 is carried out. This step includes downloading, using a wireless connection (e.g., wireless connection shown between test devices 645 and test application controller 604 shown in FIG. 6), on said test device one or more TSP test applications stored on a test application controller. With the TSP test applications loaded onto the test device, method 1100 proceeds to step 1110, which involves testing TSP functionalities of said test device. Step 1110 is carried out using the test application controller in conjunction with the TSP robot and one or more of the TSP test applications downloaded on the test device.

Next, step 1112 includes generating a TSP test result, which indicates whether the test device passed or failed the testing of TSP functionalities. If the TSP test result indicates that the test device passed the testing of TSP functionalities, then method 1100 advances to step 1114. This step involves conveying the test device present at the occupied TSP testing jig to a TSP unload conveyor (e.g., TSP unload conveyor 250 shown in FIG. 3A). The conveyance of the test device may be carried out using a TSP load/unload robot (e.g., TSP load/unload robot 244 of FIG. 2A). If, however, the TSP test result indicates that the test device failed the testing of TSP functionalities, then method 1100 advances from step 1112 to step 1116, without performing step 1114. Step 1116 involves removing, using the TSP load/unload robot, the test device present at the occupied TSP testing jig to a TSP reject conveyor (e.g., TSP reject conveyor 252 shown in FIG. 3A).

Method of TSP testing 1100, preferably, includes testing using multiple TSP testing jigs to achieve greater throughput of tested devices using the present TSP testing methods. Under this approach, the method includes: (i) determining or receiving information whether one or more of multiple TSP testing jigs (which are present inside the TSP testing subsystem) are vacant; (ii) determining, using the TSP load conveyor sensor, whether one or more of the multiple test devices are detected, one the test device at a time, on the TSP load conveyor; and (iii) placing, using the TSP load/unload robot, the multiple test devices, one the test device at a time, on the multiple vacant TSP testing jigs until the multiple vacant TSP testing jigs are filled and the multiple test devices fill the multiple vacant TSP testing jigs to produce multiple occupied TSP testing jigs inside the TSP testing subsystem.

Once all the multiple vacant TSP testing jigs are filled, then testing of TSP functionalities, at the different TSP testing jigs, may be simultaneously carried out. To this end, method of TSP testing 1100, preferably, further includes testing simultaneously TSP functionalities of the multiple test devices after the multiple occupied TSP testing jigs are produced inside the TSP testing subsystem.

Another preferable step, in method of TSP testing 1100 includes placing, using same the TSP load/unload robot, another test device on the vacant TSP testing jig after the steps of either conveying or removing vacate the TSP testing jig by unloading the test device therefrom. In other words, when a TSP load/unload robot vacates a TSP testing jig, then the same TSP load/unload robot, preferably, places another test device on the vacant TSP testing jig.

FIG. 12 shows a flow chart of a method of TSP testing 1200, according to one embodiment of the present teachings. Method 1200 may begin with a step 1202, which includes loading, using a download load/unload robot (e.g., download load/unload robot 224 of FIG. 2A) on a downloading testing jig (e.g., download testing jig 226 of FIG. 2A) present inside download testing subsystem (e.g., download testing subsystem 220 of FIG. 2A).

Next, a step 1204 includes downloading, a download test application, on the test device. In accordance with one embodiment of the present teachings, one or more download test applications stored on a download test application controller (e.g., download test application controller 1508 of FIG. 9 or download test application controller 601 of FIG. 6) is installed on the test device using the download test application connector (e.g., download test application connector 1502 of FIG. 9).

After step 1204 concludes, a step 1206 is carried out. This step involves installing a wireless connection profile on the test device and is substantially similar to step 1708 of FIG. 17. Method 1200 then proceeds to a step 1208, which involves transporting the test device from a download testing subsystem (e.g., downloading testing subsystem 120 of FIG. 1A) to a TSP testing subsystem (e.g., TSP testing subsystem 140 of FIG. 1A). By way of example, step 1208 is carried out using a download load/unload robot 224 of FIG. 2A and a TSP load/unload robot 244 of FIG. 3A.

Next, method 1200 advances to a step 1210, which includes launching, through the wireless connection, at least one of the download test applications, on the test device present inside the TSP testing subsystem. Step 1210 is performed using the test application controller (e.g., test application controller 1658 of FIG. 10 or test application controller 608 of FIG. 6).

Then, a step 1212 is performed and includes retrieving a device identification code (e.g., an IMEI number) of the test device and is substantially similar to step 1714 of FIG. 17.

After the device identification code of the test device is retrieved, it may be stored on the test application controller. Regardless of whether the device identification code is stored or not, the test device present inside the TSP testing subsystem is ready for testing. To this end, a step 1214 includes testing TSP functionalities of the test device in a next step, step 1216, TSP test results of the test device are obtained. Finally, in a step 1218 and, preferably, using the test application controller, the TSP test results obtained for the test device are associated with its device identification code and stored on the test application controller.

Figure 13:
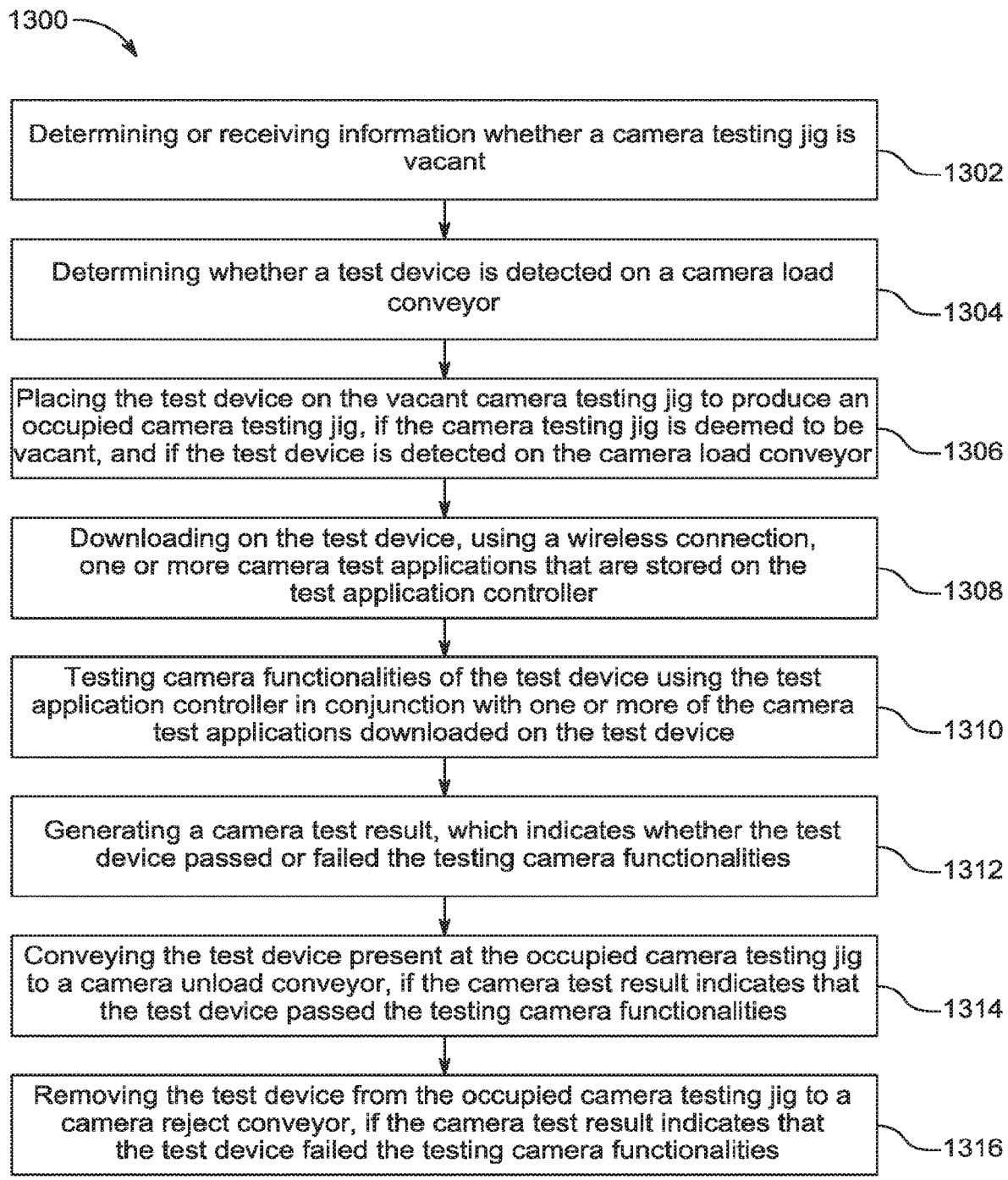
FIG. 13 shows a flowchart of a method of testing, according to one embodiment of the present teachings, camera functionalities of a test device.

FIG. 13 shows a flow chart of a method of camera testing 1300, according to one embodiment of the present teachings. Method 1300 may begin with a step 1302, which includes determining or receiving information whether a camera testing jig (e.g., camera testing jig 266 of FIG. 4A) is vacant. Next, a step 1304 includes determining whether a test device (e.g., test device 265 of FIG. 4A) is detected on a camera load conveyor (e.g., camera load conveyor 262 of FIG. 4A). Step 1304 may be performed using a camera load conveyor sensor.

If the camera testing jig is deemed to be vacant, and if the test device is detected on the camera load conveyor, then method 1300 proceeds to step 1306. This step includes placing the test device on the vacant camera testing jig to produce an occupied camera testing jig. Step 1306 is performed using a camera load/unload robot (e.g., camera load/unload robot 264 of FIG. 4A).

With the test device present on the camera testing jig, step 1308 is carried out. This step includes downloading, using a wireless connection (e.g., wireless connection shown between test devices 645 and test application controller 604 shown in FIG. 6), on said test device one or more camera test applications stored on a test application controller. With the camera test applications loaded onto the test device, method 1300 proceeds to step 1310, which involves testing camera functionalities of said test device. Step 1310 is carried out using the test application controller in conjunction with the camera robot and one or more of the camera test applications downloaded on the test device.

Next, step 1312 includes generating a camera test result, which indicates whether the test device passed or failed the testing of camera functionalities. If the camera test result indicates that the test device passed the testing of camera functionalities, then method 1300 advances to step 1314. This step involves conveying the test device present at the occupied camera testing jig to a camera unload conveyor (e.g., camera unload conveyor 270 shown in FIG. 4A). The conveyance of the test device may be carried out using a camera load/unload robot (e.g., camera load/unload robot 264 of FIG. 4A). If, however, the camera test result indicates that the test device failed the testing of camera functionalities, then method 1300 advances from step 1312 to step 1316, without performing step 1314. Step 1316 involves removing, using the camera load/unload robot, the test device present at the occupied camera testing jig to a camera reject conveyor (e.g., camera reject conveyor 272 shown in FIG. 4A).

Method of camera testing 1300 may further include: (i) determining or receiving information whether one or more of multiple camera testing jigs (which are present inside the camera testing subsystem) are vacant; (ii) determining, using the camera load conveyor sensor, whether one or more of the multiple test devices are detected, one the test device at a time, on the camera load conveyor; and (iii) placing, using the camera load/unload robot, the multiple test devices, one the test device at a time, on the multiple vacant camera testing jigs until the multiple vacant camera testing jigs are filled and the multiple test devices fill the multiple vacant camera testing jigs to produce multiple occupied camera testing jigs inside the camera testing subsystem.

After multiple camera testing jigs are filled, camera testing may commence such that test devices, in each of the camera testing jigs, are simultaneously tested for camera functionalities. To this end, the above-described methods further include testing simultaneously camera functionalities of the multiple test devices after the multiple occupied camera testing jigs are produced inside the camera testing subsystem.

The above-described methods may further include placing, using same the camera load/unload robot, another test device on the vacant camera testing jig after the step of conveying or the step of removing, both of which vacate the camera testing jig by unloading the test device therefrom.

Figure 14:
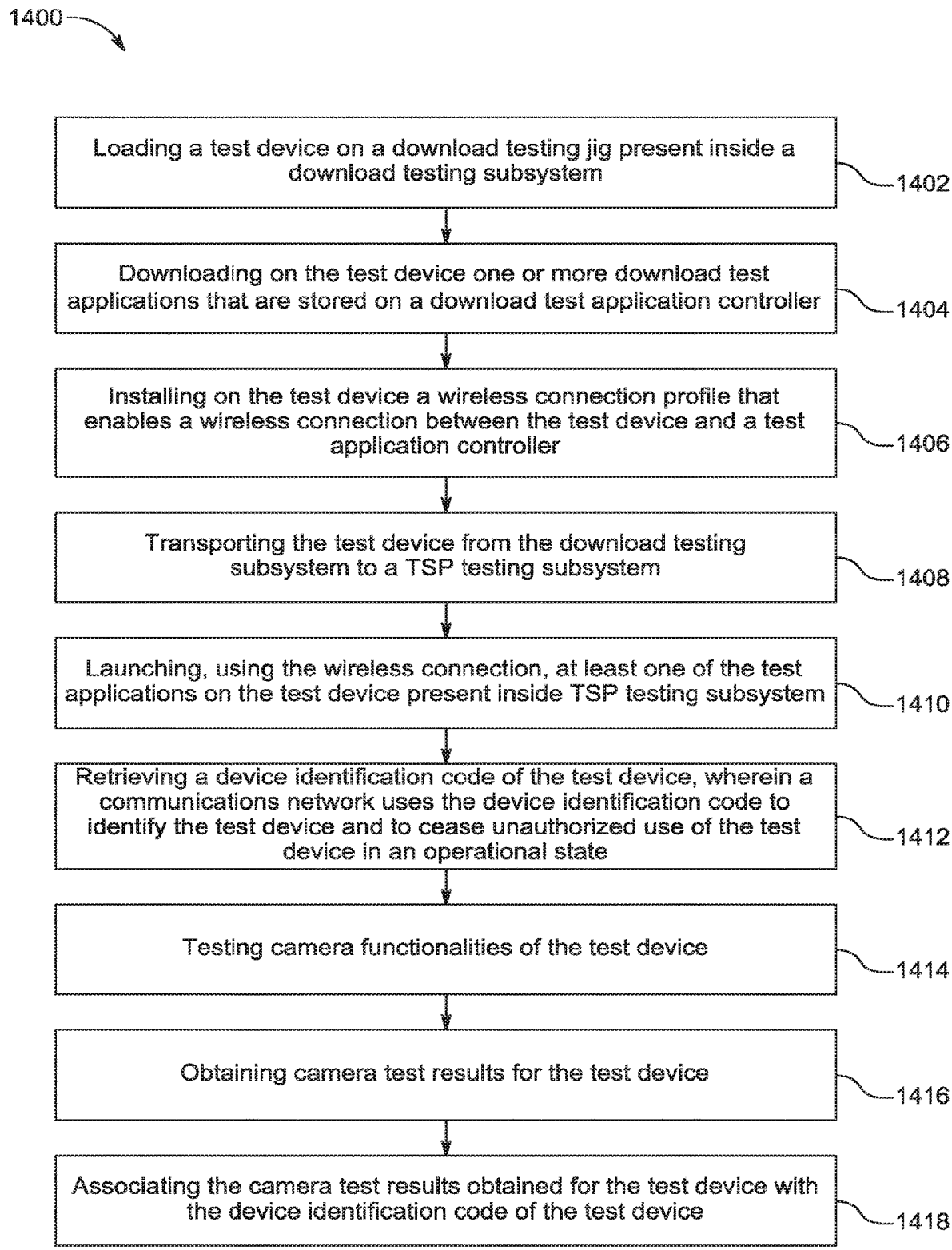
FIG. 14 shows a flowchart of a method of automatically associating, according to one embodiment of the present teachings and during testing of a particular test device, camera functionalities' test results and the device identification code of that test device.

FIG. 14 shows a flow chart of a method of camera testing 1400, according to one embodiment of the present teachings. Method 1400 includes steps 1402, 1404, 1406, 1408, 1410 and 1412, which are substantially similar to their counterparts, i.e., steps 1202, 1204, 1206, 1208, 1210 and 1212, of FIG. 12.

After the device identification code of the test device is retrieved in step 1412, method 1400 advances to a step 1414, which includes testing camera functionalities of the test device. In a next step, step 1416, camera test results of the test device are obtained. Finally, in a step 1418 and, preferably, using the test application controller, the camera test results obtained for the test device are associated with its device identification code and stored on the test application controller.

FIG. 15 shows a flow chart of a method of audio testing 1500, according to one embodiment of the present teachings. Method 1500 may begin with a step 1502, which includes determining or receiving information whether an audio testing jig (e.g., audio testing jig 286 of FIG. 5B) is vacant. Next, a step 1504 includes determining whether a test device (e.g., test device 285 of FIG. 5B) is detected on an audio load conveyor (e.g., audio load conveyor 282 of FIG. 5B). Step 1504 may be performed using a camera load conveyor sensor.

If the audio testing jig is deemed to be vacant, and if the test device is detected on the audio load conveyor, then method 1500 proceeds to step 1506. This step includes placing the test device on the vacant audio testing jig to produce an occupied audio testing jig. Step 1506 is performed using an audio load/unload robot (e.g., audio load/unload robot 284 of FIG. 5B).

With the test device present on the audio testing jig, step 1508 is carried out. This step includes downloading, using a wireless connection (e.g., wireless connection shown between test devices 645 and test application controller 604 shown in FIG. 6), on said test device one or more audio test applications stored on a test application controller. With the audio test applications loaded onto the test device, method 1500 proceeds to step 1510, which involves testing audio functionalities of said test device. Step 1510 is carried out using the test application controller in conjunction with the audio robot and one or more of the audio test applications downloaded on the test device.

Next, step 1512 includes generating an audio test result, which indicates whether the test device passed or failed the testing of audio functionalities. If the audio test result indicates that the test device passed the testing of audio functionalities, then method 1500 advances to step 1514. This step involves conveying the test device present at the occupied audio testing jig to an audio unload conveyor (e.g., audio unload conveyor 290 shown in FIG. 5B). The conveyance of the test device may be carried out using an audio load/unload robot (e.g., audio load/unload robot 284 of FIG. 5B). If, however, the camera test result indicates that the test device failed the testing of camera functionalities, then method 1500 advances from step 1512 to step 1516, without performing step 1514. Step 1516 involves removing, using the camera load/unload robot, the test device present at the occupied camera testing jig to a camera reject conveyor (e.g., camera reject conveyor 292 shown in FIG. 5B).

Method of audio testing 1500 may further include: (i) determining or receiving information whether one or more of multiple audio testing jigs (which are present inside the audio box of the audio testing subsystem) are vacant; (ii) determining, using the audio load conveyor sensor, whether one or more of the multiple test devices are detected, one the test device at a time, on the audio load conveyor; and (iii) placing, using the audio load/unload robot, the multiple test devices, one the test device at a time, on the multiple vacant audio testing jigs until the multiple vacant audio testing jigs are filled and the multiple test devices fill the multiple vacant audio testing jigs to produce multiple occupied audio testing jigs inside the audio testing subsystem.

After multiple audio testing jigs are filled, audio testing may commence such that test devices, in each of the audio testing jigs, are simultaneously tested for audio functionalities. To this end, method of audio testing 1500 further includes testing simultaneously audio functionalities of the multiple test devices after the multiple occupied audio testing jigs are produced inside the audio testing subsystem.

Method of audio test 1500 may further include placing, using same the audio load/unload robot, another test device on the vacant audio testing jig after the step of conveying or the step of removing, both of which vacate the audio testing jig by unloading the test device therefrom.

FIG. 16 shows a flow chart of a method of camera testing 1600, according to one embodiment of the present teachings. Method 1600 includes steps 1602, 1604, 1606, 1608, 1610 and 1612, which are substantially similar to their counterparts, i.e., steps 1202, 1204, 1206, 1208, 1210 and 1212, of FIG. 12.

After the device identification code of the test device is retrieved in step 1612, method 1600 advances to a step 1614, which includes testing audio functionalities of the test device. In a next step, step 1616, audio test results of the test device are obtained. Finally, in a step 1618 and, preferably, using the test application controller, the audio test results obtained for the test device are associated with its device identification code and stored on the test application controller.

Although illustrative embodiments of the present arrangements and teachings have been shown and described, other modifications, changes, and substitutions are intended. Accordingly, it is appropriate that the appended claims be construed broadly and in a manner consistent with the scope of the disclosure, as set forth in the following claims.

What is claimed is:

1. An automated functional testing system comprising:
a touch screen panel ("TSP") load conveyor for carrying test device inside a TSP load/unload region of a TSP testing subsystem;
a TSP unload conveyor for removing from said TSP load/unload region of said TSP testing subsystem test device that passes testing inside said TSP testing subsystem;
a TSP reject conveyor for removing from said TSP load/unload region of said TSP testing subsystem test device that fails testing inside said TSP testing subsystem;
multiple TSP testing jigs disposed between said TSP load conveyor and said TSP unload conveyor or said TSP reject conveyor;
multiple TSP testing shuttles, each of which has one of said TSP testing jigs secured thereon and, during an operational state of said TSP testing shuttle, displaces one of said TSP testing jigs, in Y-direction, back and forth from said TSP load/unload region to a TSP test region;
a TSP robot including a stylus end effector designed to contact predetermined contact regions on display screen of test device for testing TSP functionalities of test device; and
a TSP load/unload robot, in a first operative state, transfers test device from said TSP load conveyor to one of said multiple TSP testing jigs, wherein said TSP load/unload robot, in a second operative state, transfers test device from one of said multiple TSP testing jigs to said TSP unload conveyor when test device passes testing inside said TSP testing subsystem, and wherein said TSP load/unload robot, in a third another operative state, transfers test device from one of said multiple TSP testing jigs to said TSP reject conveyor when test device fails testing inside said TSP testing subsystem; wherein said TSP load/unload robot is different from said TSP robot.

2. The automated functional testing system of claim 1, further comprising a TSP robot controller that controls operation of each of said TSP load/unload robot, said TSP robot and multiple of said TSP testing shuttle.

3. The automated functional testing system of claim 2, further comprising a test application controller that controls operation of said TSP robot controller and provides TSP test applications to test TSP functionalities of test device.

4. The automated functional testing system of claim 1, wherein said TSP reject conveyor extends in a direction that is perpendicular to a direction of extension of said TSP load conveyor or of said TSP unload conveyor.

5. The automated functional testing system of claim 1, wherein said TSP load conveyor aligns with or is same as download unload conveyor that is part of a download testing subsystem, and wherein said TSP unload conveyor aligns with or is same as a camera load conveyor that is part of a camera testing subsystem.

6. The automated functional testing system of claim 1, Wherein said TSP load/unload robot, in said first, said second and said third operative states, traverses in X-direction to load or unload test device in said TSP load/unload region, before and after testing inside said TSP subsystem.

7. The automated functional testing system of claim 1, further comprising:
a download testing subsystem arranged prior to said TSP testing subsystem;
a camera testing subsystem arranged after said TSP testing subsystem, such that inside said download testing subsystem, download functionalities of test device are tested, inside said TSP testing subsystem, TSP functionalities of test device are tested and inside camera testing subsystem, camera functionalities of test device are tested.

8. A method of automated functional testing, said method comprising:
determining or receiving information whether one or more of multiple TSP testing jigs are vacant, wherein said multiple TSP testing jigs are present inside said TSP testing subsystem;
determining, using said TSP load conveyor sensor, whether one or more of multiple test devices are detected, one said test device at a time, on said TSP load conveyor; and
placing, using said TSP load/unload robot, said multiple test devices, one said test device at a time, on said multiple vacant TSP testing jigs until said multiple vacant TSP testing jigs are filled and said multiple test devices fill said multiple vacant TSP testing jigs to produce multiple occupied TSP testing jigs inside said TSP testing subsystem;
downloading, using a wireless connection and on said test device, one or more TSP test applications that are stored on a test application controller;
testing, using one or more of said TSP test applications in conjunction with said TSP robot, TSP functionalities of said test device;
generating a TSP test result, which indicates whether said test device passed or failed said testing TSP functionalities;
conveying, using said TSP load/unload robot, said test device present at said occupied TSP testing jig to a TSP unload conveyor, if said TSP test result indicates that said test device passed said testing TSP functionalities; and
removing, using said TSP load/unload robot, said test device from said occupied TSP testing jig to a TSP reject conveyor, if said TSP test result indicates that said test device failed said testing TSP functionalities.

9. The method of automated functional testing of claim 8, further comprising performing download testing prior to said determining or said receiving information whether download testing jig is vacant, wherein said performing includes:
determining or receiving information whether a download testing jig is vacant, wherein said download testing jig is present inside a download testing subsystem;
determining, using a download load conveyor sensor, whether a test device is detected on a download load conveyor;
placing, using a download load/unload robot, said test device on said vacant download testing jig to produce an occupied download testing jig, if said download testing jig is deemed vacant, and if said test device is detected on said download load conveyor;

introducing, using a download robot, a download test application connector inside a test application receiving port on said test device to form a download test application connection;

downloading on said test device, using said download test application connection, one or more download test applications stored on a download test application controller, wherein said download test application controller is different from said test application controller;

testing download functionalities of said test device, using said download test application controller in conjunction with one or more of said download test applications stored on said test device;

generating a download test result, which indicates whether said test device passed or failed said testing download functionalities;

conveying, using said download load/unload robot, said test device present at said occupied download testing jig to a download unload conveyor, if said download test result indicates that said test device passed said testing download functionalities; and removing, using said download load/unload robot, said test device from said occupied download testing jig to a download reject conveyor, if said download test result indicates that said test device failed said testing download functionalities.

10. The method of automated functional testing of claim 8, further comprising testing simultaneously TSP functionalities of said multiple test devices after said multiple occupied TSP testing jigs are produced inside said TSP testing subsystem.

11. The method of automated functional testing of claim 8, further comprising placing, using same said TSP load/unload robot, another of said test devices on said vacant TSP testing jig after said conveying or said removing vacates said TSP testing jig by unloading said test device therefrom.

12. The method of automated functional testing of claim 8, wherein said testing TSP functionalities of said test device includes testing one without-axis functionality chosen from a group comprising wireless connection-related functionality, short range wireless interconnection-related functionality, and charging functionality of said test device, and wherein without-axis functionality refers to functionalities that do not require linear movement of said test device along any of X-direction, Y-direction and Z-direction.

13. The method of automated functional testing of claim 8, wherein said testing TSP functionalities of said test device includes drawing, using a stylus robot, a pattern on said display screen of said test device, wherein said drawing includes moving said stylus robot in X-direction, Y-direction and Z-direction, and wherein said drawing said pattern is carried out when one or more of said TSP test applications are active on said test device.

14. The method of automated functional testing of claim 8, wherein said testing TSP functionalities of said test device includes testing three-dimensional functionalities, which include moving said stylus robot in X-direction, Y-direction and Z-direction, and wherein said moving said stylus robot in Z-direction comprises:

contacting, using said stylus robot, one or more predetermined contact regions on said display screen of said test device;

applying varying amount of pressure on each of one or more of said predetermined contact regions; and evaluating an amount of light emitted through said display screen under varying amount of pressure.

15. The method of automated functional testing of claim 14, wherein one or more of said predetermined contact regions are scattered on said display device so that different parts of said displays screen are tested during said testing TSP functionalities.

16. The method of automated functional testing of claim 8, wherein after said testing TSP functionalities of said test device is complete, providing said test results from said test application controller to said TSP load/unload robot.

17. The method of automated functional testing of claim 8, further comprising testing camera functionalities of said test device, in a camera testing subsystem, after said conveying said test device to a TSP unload conveyor.

18. The method of automated functional testing of claim 8, wherein said testing TSP functionalities includes testing for at least one functionality of said test device chosen from a group comprising test application launching functionality, applications launching functionality, wireless connection-related functionality, short range wireless interconnection-related functionality, geometric sensing-related functionality, global positioning system ("GPS")-related functionality, charging functionality, touch screen functionality, three-dimensional touch functionality, advance touch functionality and with-axis functionality.

19. A process for automatic functional testing, said process comprising:

loading, using a download loading/unloading robot, a test device on a download testing jig present inside a download testing subsystem;

installing on said test device, using a download robot including a download test application connector, a wireless connection profile that enables a wireless connection between said test device and a test application controller, wherein said download loading/unloading robot is different from said download robot;

conveying, using said download loading/unloading robot and a touch screen panel ("TSP") loading/unloading robot, said test device from said download testing subsystem to a TSP testing subsystem;

launching, using said test application controller, said wireless connection profile on said test device present inside said TSP testing subsystem to establish a wireless connection between said test device and said test application controller; and retrieving, using said wireless connection, from said test device a device identification code of said test device, wherein a communications network uses said device identification code to identify said test device and to cease unauthorized use of said test device in an operational state.

20. The method of automated functional testing of claim 19, further comprising downloading, using said download test application connector, on said test device one or more download test applications and/or an operating system, each of which is stored on a download test application controller, wherein said download test application controller is different from said test application controller, and wherein said installing is carried out after or at same time as said downloading.

21. The method of automated functional testing of claim 19, further comprising storing, said device identification code on said test application controller.

22. The method of automated functional testing of claim 19, further comprising:

testing, using a TSP robot, TSP functionalities of said test device;

obtaining, using said test application controller, TSP test results of said test device generated from said testing TSP functionalities; and associating and storing, using said test application controller, said TSP test results of said test device with said device identification code of said test device.

23. The method of automated functional testing of claim 19, further comprising introducing, using a TSP robot, a TSP test application connector inside a test application receiving port on said test device to form a TSP test application connection, wherein said launching includes using said TSP test application connection in conjunction with said test application controller and wherein said introducing is carried out before said launching is carried out.

* * * * *